US011026041B2

(12) United States Patent
Chen et al.

(10) Patent No.: US 11,026,041 B2
(45) Date of Patent: Jun. 1, 2021

(54) COMPENSATION OF OWN VOICE OCCLUSION

(71) Applicant: Cirrus Logic International Semiconductor Ltd., Edinburgh (GB)

(72) Inventors: Zhangli Chen, Edinburgh (GB); Brenton Steele, Edinburgh (GB); Thomas Ivan Harvey, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/751,738

(22) Filed: Jan. 24, 2020

(65) Prior Publication Data

US 2020/0304936 A1 Sep. 24, 2020

Related U.S. Application Data

(63) Continuation of application No. 16/356,218, filed on Mar. 18, 2019, now Pat. No. 10,595,151.

(51) Int. Cl.

| | |
|---|---|
| ***H03G 5/00*** | (2006.01) |
| ***H04S 7/00*** | (2006.01) |
| ***H04R 3/04*** | (2006.01) |
| ***H04R 5/04*** | (2006.01) |
| ***H04R 5/033*** | (2006.01) |

(52) U.S. Cl.

CPC ............... *H04S 7/307* (2013.01); *H04R 3/04* (2013.01); *H04R 5/033* (2013.01); *H04R 5/04* (2013.01); *H04R 2460/01* (2013.01); *H04R 2460/05* (2013.01); *H04S 2420/01* (2013.01)

(58) Field of Classification Search

CPC ........... H04S 7/307; H04R 3/04; H04R 5/033; H04R 5/04

See application file for complete search history.

(56) References Cited

U.S. PATENT DOCUMENTS

| | | | |
|---|---|---|---|
| 4,985,925 | A | 1/1991 | Langberg et al. |
| 5,267,321 | A | 11/1993 | Langberg |

(Continued)

OTHER PUBLICATIONS

Equalization (audio), https://en.wikipedia.org/wiki/Equalization_(audio), retrieved Jan. 15, 2021.

*Primary Examiner* — Simon King

(74) *Attorney, Agent, or Firm* — Jackson Walker L.L.P.

(57) ABSTRACT

A method of equalising sound in a headset comprising an internal microphone configured to generate a first audio signal, an external microphone configured to generate a second audio signal, a speaker, and one or more processors coupled between the speaker, the external microphone, and the internal microphone, the method comprising: while the headset is worn by a user: determining a first audio transfer function between the first audio signal and the second audio signal in the presence of sound at the external microphone; and determining a second audio transfer function between a speaker input signal and the first audio signal with the speaker being driven by the speaker input signal; determining an electrical transfer function of the one or more processors; determining a closed-ear transfer function based on the first audio transfer function, the second audio transfer function and the electrical transfer function; and equalising the first audio signal based on a comparison between the closed-ear transfer function and an open-ear transfer function to generate an equalised first audio signal.

10 Claims, 13 Drawing Sheets

(56) References Cited

U.S. PATENT DOCUMENTS

| | | | | |
|---|---|---|---|---|
| 9,020,160 | B2 | 4/2015 | Gauger, Jr. | |
| 2011/0299695 | A1* | 12/2011 | Nicholson | G10K 11/17854 381/71.6 |
| 2012/0170766 | A1 | 7/2012 | Alves et al. | |
| 2015/0172815 | A1* | 6/2015 | Park | G10K 11/17823 381/93 |
| 2017/0148428 | A1* | 5/2017 | Thuy | G10K 11/17854 |
| 2018/0268798 | A1* | 9/2018 | Mustiere | H04R 3/005 |
| 2019/0043518 | A1* | 2/2019 | Li | G10L 21/0216 |
| 2019/0214038 | A1* | 7/2019 | Bouserhal | G10L 25/84 |

* cited by examiner

COMPENSATION OF OWN VOICE OCCLUSION

This application is a continuation of U.S. patent application Ser. No. 16/356,218, filed Mar. 18, 2019, issued as U.S. Pat. No. 10,595,151 on Mar. 17, 2020, which is incorporated by reference herein in its entirety.

TECHNICAL FIELD

The present disclosure relates to methods of and apparatus for compensating for ear occlusion.

BACKGROUND

Many hearing devices, such as headsets, hearing aids, and hearing protectors, have tightly sealing earbuds or earcups that occlude ears and isolate the users from environmental noise. This isolation has two side effects when users want to listen to their own-voice (OV), such as when making a phone call or talking to a person nearby without taking the devices off their ears. One of the side effects is the passive loss (PL) at high frequency, which makes the user's own voice sounded muffled to them. The other effect is the amplification of the user's own voice at low frequency, which makes their voice sounded boomy to them. The amplification of a user's own voice at low frequency is commonly referred to as the occlusion effect (OE).

The OE occurs primarily below 1 kHz and is dependent on ear canal structure of the user, the fitting tightness of hearing devices, and the phoneme being pronounced by the user. For example, for front open vowels such as [a:], the OE is usually only several decibels (dB), whereas for back closed vowels such as [i:], the OE can be over 30 dB.

Feedback active noise cancellation (ANC) is a common method used in noise cancelling headphones to compensate for OE. Feedback ANC uses an internal microphone, located near the eardrum, and a headset speaker to form a feedback loop to cancel the sound near the eardrum. Using feedback ANC to counteract OE is described in U.S. Pat. Nos. 4,985,925 and 5,267,321, the content of each of which is hereby incorporated by reference in its entirety. The methods described in these patents require all of the parameters of the feedback ANC to be preset based on an average OE of a user. U.S. Pat. No. 9,020,160, the content of which is hereby incorporated by reference in its entirety, describes updating feedback loop variables of a feedback ANC filter to account for changes in phenomes being pronounced by a user.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each of the appended claims.

SUMMARY

The present disclosure provides methods for restoring the naturalness of a user's own voice using novel signal analysis and processing.

According to an aspect of the disclosure, there is provided a method of equalising sound in a headset comprising an internal microphone configured to generate a first audio signal, an external microphone configured to generate a second audio signal, a speaker, and one or more processors coupled between the speaker the external microphone, and the internal microphone, the method comprising: while the headset is worn by a user: determining a first audio transfer function between the first audio signal and the second audio signal in the presence of sound at the external microphone; and determining a second audio transfer function between a speaker input signal and the first audio signal with the speaker being driven by the speaker input signal; determining an electrical transfer function of the one or more processors; determining a closed-ear transfer function based on the first audio transfer function, the second audio transfer function and the electrical transfer function; and equalising the first audio signal based on a comparison between the closed-ear transfer function and an open-ear transfer function to generate an equalised first audio signal.

The comparison may be a frequency domain ratio between the closed-ear transfer function and the open-ear transfer function. The comparison may be a time-domain difference between the closed-ear transfer function and the open-ear transfer function.

The open-ear transfer function may be a measured open-ear transfer function between an ear-entrance or an eardrum of the user. Alternatively, the open-ear transfer function may be a measured open-ear transfer function between an ear-entrance and an ear-drum of a head simulator. Alternatively, the open-ear transfer function may be an average open-ear transfer function of a portion of the general population.

The method may further comprise a) measuring the open-ear transfer function between an ear-entrance or an eardrum of the user; or b) measuring the open-ear transfer function between an ear-entrance and an ear-drum of a head simulator; or c) determining the open-ear transfer function based on an average open-ear transfer function for a portion of the general population.

The step of determining the first audio transfer function may be performed with the speaker muted.

The step of determining the second audio transfer function may be performed in the presence of little or no sound external to the headset.

Determining the electrical path transfer function may comprise determining a frequency response of a feedforward ANC filter implemented by the one or more processors and/or a frequency response of a feedback ANC filter implemented by the one or more processors.

Determining the frequency response may comprise determining a gain associated with the one or more processors.

The method may further comprise determining an open-ear transfer function between an ear-entrance and an ear-drum of the user comprises approximating the open-ear transfer function of the user.

The method may further comprise outputting the equalised first audio signal to the speaker.

The method may further comprise: determining a third audio transfer function between the first audio signal and the second audio signal while the headset is worn by the user and the user is speaking; and further equalising the equalised first audio signal based on the third transfer function.

The method may further comprise, on determining that the user is speaking, outputting the voice equalised first audio signal to the speaker.

The method may further comprise determining that the one or more processors is implementing active noise cancellation (ANC); and adjusting the further equalisation to account for the one or more processors implementing ANC.

The method may further comprise requesting that the user to speak a phoneme balanced sentence or phrase. The third audio transfer function may be determined while the user is speaking the phoneme balanced sentence.

According to another aspect of the disclosure, there is provided an apparatus, comprising: a headset comprising: an internal microphone configured to generate a first audio signal; an external microphone configured to generate a second audio signal; a speaker; and one or more processors configured to: while the headset is worn by a user: determine a first audio transfer function between the first audio signal and the second audio signal in the presence of sound at the external microphone; and determine a second audio transfer function between a speaker input signal and the first audio signal with the speaker being driven by the speaker input signal; determine an electrical transfer function of the one or more processors; determine a closed-ear transfer function based on the first audio transfer function, the second audio transfer function and the electrical transfer function; and equalise the first audio signal based on a comparison between the closed-ear transfer function and an open-ear transfer function to generate an equalised first audio signal.

The comparison may be a frequency domain ratio between the closed-ear transfer function and the open-ear transfer function. The comparison may be a time-domain difference between the closed-ear transfer function and the open-ear transfer function.

The open-ear transfer function may be a measured open-ear transfer function between an ear-entrance or an eardrum of the user. Alternatively, the open-ear transfer function may be a measured open-ear transfer function between an ear-entrance and an ear-drum of a head simulator. Alternatively, the open-ear transfer function may be an average open-ear transfer function of a portion of the general population.

The one or more processors may be further configured to: a) measuring the open-ear transfer function between an ear-entrance or an eardrum of the user; or b) measuring the open-ear transfer function between an ear-entrance and an ear-drum of a head simulator; or c) determining the open-ear transfer function based on an average open-ear transfer function for a portion of the general population.

The step of determining the first audio transfer function may be performed with the speaker muted.

The step of determining the second audio transfer function may be performed in the presence of little or no sound external to the headset.

Determining the electrical path transfer function may comprise determining a frequency response of a feedforward ANC filter implemented by the one or more processors and/or a frequency response of a feedback ANC filter implemented by the one or more processors.

Determining the electrical path transfer function may comprise determining a gain associated with the one or more processors.

Determining an open-ear transfer function between an ear-entrance and an eardrum of the user comprises approximating the open-ear transfer function.

The one or more processors may be further configured to, on determining that the user is not speaking, outputting the equalised first audio signal to the speaker.

The one or more processors may be further configured to determine a third audio transfer function between the first audio signal and the second audio signal while the headset is worn by the user and the user is speaking; and further equalise the equalised first audio signal based on the difference between the open-ear transfer function and the closed-ear transfer function to generate a voice equalised first audio signal.

The one or more processors may be further configured to, on determining that the user is speaking, output the voice equalised first audio signal to the speaker.

The one or more processors may be further configured to determine that the one or more processors is implementing active noise cancellation (ANC); and adjusting the further equalisation to account for the one or more processors implementing ANC.

The one or more processors may be further configured to output a request to the user to speak a phoneme balanced sentence or phrase, wherein the third audio transfer function is determined while the user is speaking the phoneme balanced sentence.

According to another aspect of the disclosure, there is provided a method of equalising sound in a headset comprising an internal microphone configured to generate a first audio signal, an external microphone configured to generate a second audio signal, a speaker, and one or more processors coupled between the speaker the external microphone, and the internal microphone, the method comprising: determining a first audio transfer function between the first audio signal and the second audio signal while the headset is worn by the user and the user is speaking; and equalising the first audio signal based on the first audio transfer function.

The method may further comprise, on determining that the user is speaking, outputting the voice equalised first audio signal to the speaker.

The method may further comprise determining that the one or more processors is implementing active noise cancellation (ANC); and adjusting the equalisation to account for the ANC.

The method may further comprise requesting that the user speak a phoneme balanced sentence or phrase. The first audio transfer function may then be determined while the user is speaking the phoneme balanced sentence.

According to another aspect of the disclosure, there is provided an apparatus, comprising: a headset comprising: an internal microphone configured to generate a first audio signal; an external microphone configured to generate a second audio signal; a speaker; and one or more processors configured to: determine a first audio transfer function between the first audio signal and the second audio signal while the headset is worn by the user and the user is speaking; and equalise the first audio signal based on the difference between the open-ear transfer function and the closed-ear transfer function to generate an equalised first audio signal.

The one or more processors may be further configured to: on determining that the user is speaking, output the equalised first audio signal to the speaker.

The one or more processors may be further configured to: determine that the one or more processors is implementing active noise cancellation (ANC); and adjust the equalisation to account for the ANC.

The one or more processors may be further configured to: request that the user speak a phoneme balanced sentence or phrase, wherein the first audio transfer function is determined while the user is speaking the phoneme balanced sentence.

The headset may comprise one or more of the one or more processors.

According to another aspect of the disclosure, there is provided an electronic device comprising the apparatus as described above.

Throughout this specification the word “comprise”, or variations such as “comprises” or “comprising”, will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting example only with reference to the accompanying drawings, in which.

DESCRIPTION OF EMBODIMENTS

Figure 1:
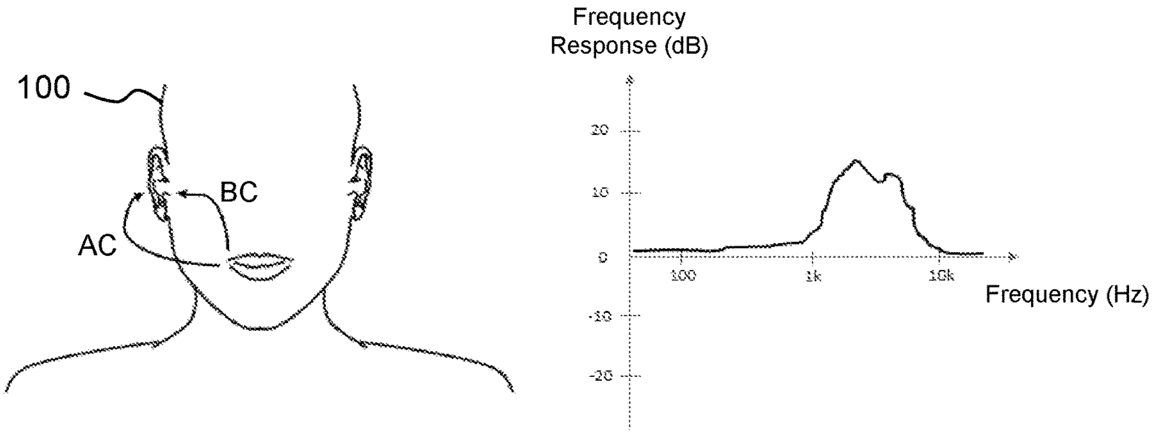
FIG. 1 is a schematic illustration of acoustic conduction and bone conduction paths around and through a head of a user.
Figure 2:
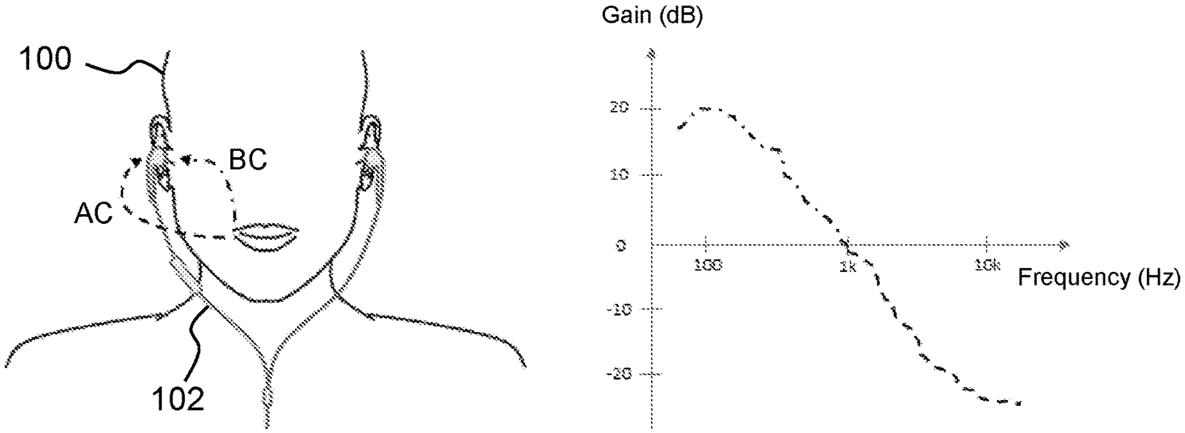
FIG. 2 is a schematic illustration of acoustic conduction and bone conduction paths around and through a head of the user shown in FIG. 1 wearing headphones.

FIGS. 1 and 2 comparatively illustrate the effect of ear occlusion to a user's own-voice. FIG. 1 shows the scenario where a user 100 is not wearing headphones. There exists and acoustic conduction path between the user's 100 mouth and ear through the air and a bone-conduction path internal to the user's 100 head between the mouth and ear. The line on the graph in FIG. 1 represents a typical open ear frequency response of the user 100 from ear entrance to eardrum. FIG. 2 shows the gain between the closed ear frequency response and the open ear frequency response of the user 100 wearing the headphones 102 and speaking.

Isolation of the user's 100 eardrums from the external environment has two side effects when users want to listen to their own-voice (OV). One of the side effects is the passive loss (PL) at high frequency which leads to a relatively attenuated high frequency sound at the user's eardrum as shown in the graph in FIG. 2. This attenuation makes the user's own voice sounded muffled to them. The other effect of blocking the ear is the amplification of the user's 100 own voice at low frequency, which makes their voice sounded boomy to them. This amplification is also shown in the graph in FIG. 2. The amplification of a user's own voice at low frequency is commonly referred to as the occlusion effect (OE).

Embodiments of the present disclosure relate to methods for a) restoring attenuated high frequency sounds, and b) attenuating low frequency components introduced due to the occlusion effect with an aim of restoring the user's 100 voice such that when wearing a headset, his voice sounds substantially as if he wasn't wearing the headset.

The inventors also have realised that high frequency attenuation due to passive loss occurs regardless of whether the user of the headset 200 is speaking or not, whereas low frequency boom occurs only when the user is speaking. Accordingly, in embodiments of the present disclosure, methods are presented to change equalisation in response to detecting that the user is speaking.

With the above in mind, equalisation for restoring the attenuated high frequency sounds may be referred to herein as hearing augmentation equalisation (HAEQ). Equalisation for restoring the low frequency components of sound introduced due to the occlusion effect may be referred to herein as delta hearing augmentation equalisation (dHAEQ).

Figure 3:
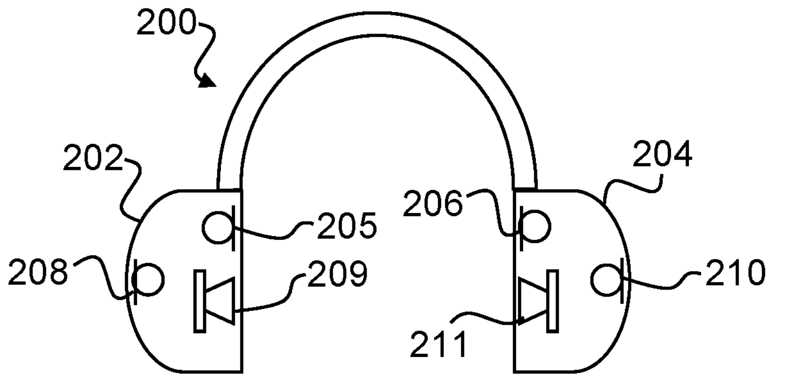
FIG. 3 is a schematic diagram of a headset according to an embodiment of the present disclosure.

FIG. 3 illustrates a headset 200 in which HAEQ and/or dHAEQ may be implemented. It will be appreciated that methods described herein may be implemented on any headset comprising two microphones, one of which is positioned external to the headset (e.g. a reference microphone) and one of which is positioned such that when the headset is worn by a user, the microphone is positioned proximate to the ear entrance (e.g. an error microphone). The microphone positioned proximate to the ear entrance may be associated with a speaker such that a feedback path exists between that microphone and the speaker.

The headset 200 shown in FIG. 3 comprises two modules 202 and 204. The modules 202, 204 may be connected, wirelessly or otherwise. Each module 202, 204 comprises an error microphone 205, 206, a reference microphone 208, 210, and a speaker 209, 211 respectively. The reference microphones 208, 210 may be positioned so as to pick up ambient noise from outside the ear canal and outside of the headset. The error microphones 205, 206 may be positioned, in use, towards the ear so as to sense acoustic sound within the ear canal including the output of the respective speakers 209, 211. The speakers 209, 211 are provided primarily to deliver sound to the ear canal of the user. The headset 200 may be configured for a user to listen to music or audio, to make telephone calls, and/or to deliver voice commands to a voice recognition system, and other such audio processing functions. The headset 200 may be configured to be worn over the ears, in which case the modules 202, 204 may be configured to fit over the ears. Equally, the modules 202, 204 may be configured to be worn in the ear canal.

Figure 4A:
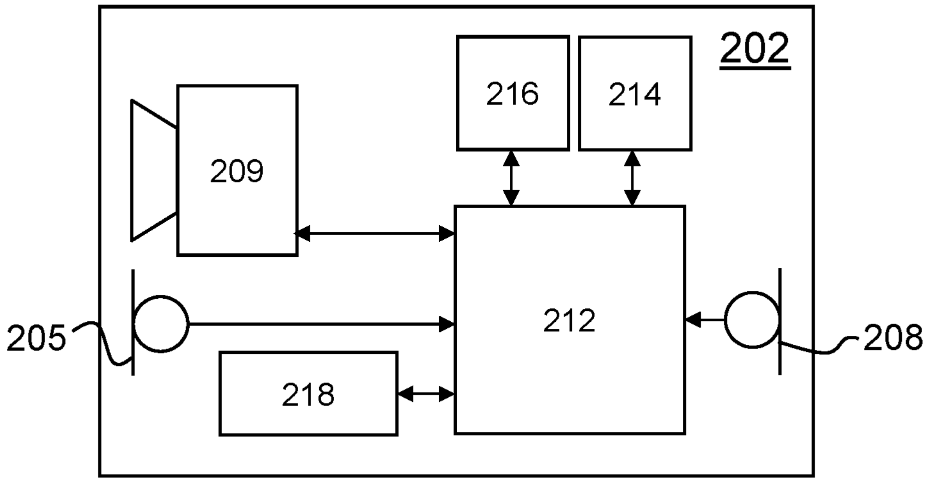
FIG. 4*a* is a schematic diagram of a module of the headset shown in FIG. 3.

FIG. 4*a* is a system schematic of the first module 202 of the headset. The second module 204 may be configured in substantially the same manner as the first module 202 and is thus not separately shown or described. In other embodiments, the headset 200 may comprise only the first module 202.

The first module 202 may comprise a digital signal processor (DSP) 212 configured to receive microphone signals from error and reference microphones 205, 208. The module 202 may further comprise a memory 214, which may be provided as a single component or as multiple components. The memory 214 may be provided for storing data and program instructions. The module 202 may further comprises a transceiver 216 to enable the module 202 to communicate wirelessly with external devices, such as the second module 204, smartphones, computers and the like. Such communications between the modules 202, 204 may in alternative embodiments comprise wired communications where suitable wires are provided between left and right sides of a headset, either directly such as within an overhead band, or via an intermediate device such as a smartphone. The module 202 may further comprise a voice activity detector (VAD) 218 configured to detect when the user is speaking. The module 202 may be powered by a battery and may comprise other sensors (not shown).

Figure 4B:
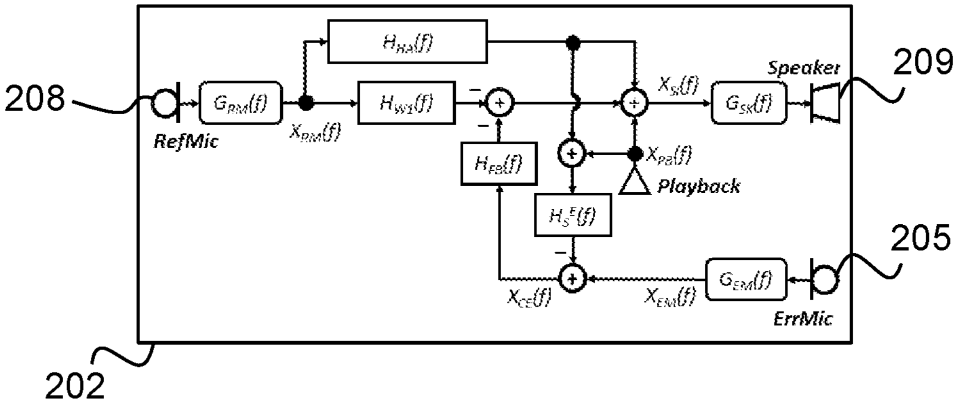
FIG. 4*b* is a block diagram showing the electrical-conduction paths present in the module shown in FIG. 4*a;*

FIG. 4*b* is a block diagram showing an exemplary electrical-conduction path for the first module 202 between the error microphone 205, the reference microphone 208 and the speaker 209. The electrical-conduction path of the first module 202 shown in FIG. 4*b* will be described in more detail below. However, briefly, the first module 202 may implement active noise cancellation (ANC) using feedback and feedforward filters, denoted in FIG. 4*b* as $H_{FB}(f)$ and $H_{W2}(f)$ respectively. Additionally, the first module 202 may implement a hearing augmentation filter (or equalisation block) $H_{HA}(f)$ configured to restore components of sound in the headset 200 of the user 100 lost due to high frequency passive loss attenuation and/or low frequency boom. Determination and application of $H_{HA}(f)$ according to various embodiments of the present disclosure will now be described.

Figure 5:
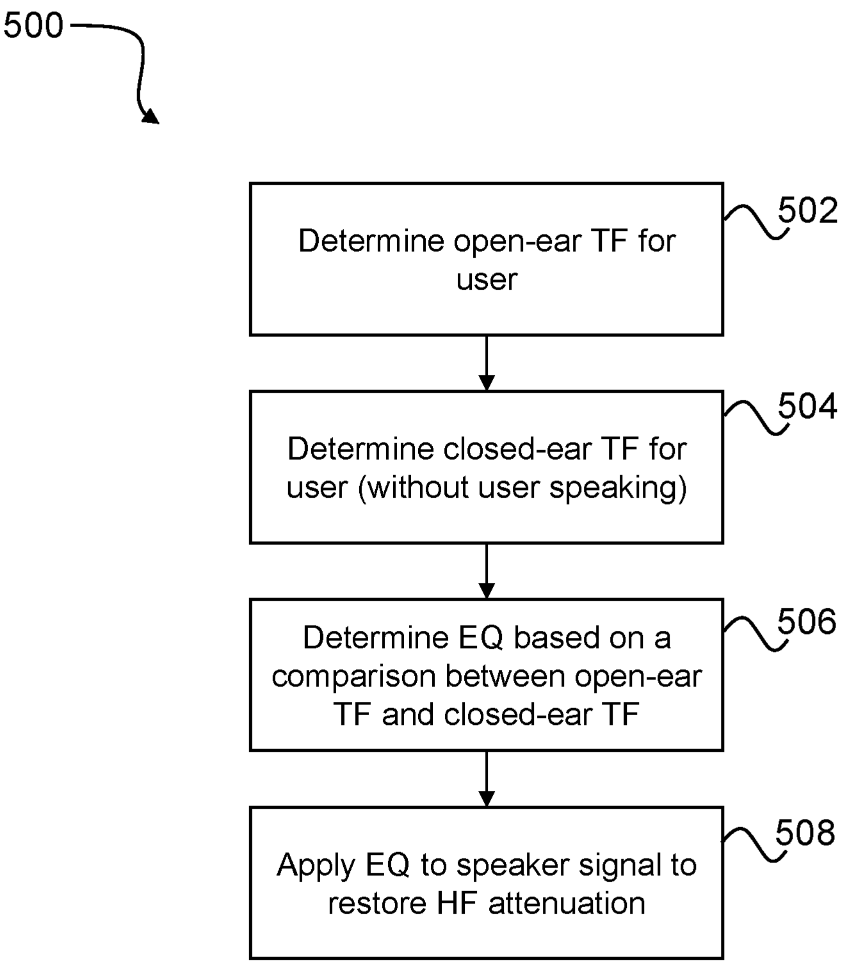
FIG. 5 is a flow diagram showing a process for determining and applying EQ in the module of FIG. 4*a* to restore high frequency attenuation at a user's eardrum.

FIG. 5 is a flowchart of a process 500 for determining $H_{HA}(f)$ to restore high frequency sound in the headset 200 of FIG. 3 attenuated due to passive loss.

At step 502 an open-ear transfer function (i.e. a transfer function of the open ear (TFOE)) may be determined. The open-ear transfer function may be measured on the user, for example, by an audiologist using microphones positioned at the ear-entrance and the eardrum. Alternatively, the open-ear transfer function may be estimated base on an average open-ear transfer function of the general population. Alternatively, the open-ear transfer function of the user may be estimated based on a transfer function measured on a head simulator, such as a KEMAR (Knowles Electronic Manikin For Acoustic Research). Various methods of determining the open-ear transfer function are known in the art and so will not be explained further here. Where the open-ear transfer function is estimated based on population data or the like, the step 502 of determining the open-ear transfer function may be omitted or may simply comprise reading a stored open-ear transfer function from memory.

At step 504, a closed-ear transfer function for the user is determined. The closed-ear transfer function may be representative of the air-conduction and electrical-conduction paths present with the user 100 wearing the headset 200.

At step 506, a hearing augmentation EQ (HAEQ) may be determined based on a comparison between the open ear transfer function and the determined closed-ear transfer function for the user 100 wearing the headset 200. For example, the HAEQ may be determined based on a ratio between open-ear transfer function and the closed-ear transfer function (in the frequency domain) or based on a dB spectral different between the open-ear and closed-ear transfer functions. This EQ represents the difference in sound reaching the eardrum of the user 100 when the user is wearing the headset 200 versus when the user is not wearing the headset 200 (i.e. the open-ear state).

After the HAEQ has been determined at step 506, HAEQ may be applied at step 508 to the input signal for the speaker 209 so as to restore the high frequency sound attenuated due to passive loss in the headset 200.

Determining Open-Ear Transfer Function

Figure 6:
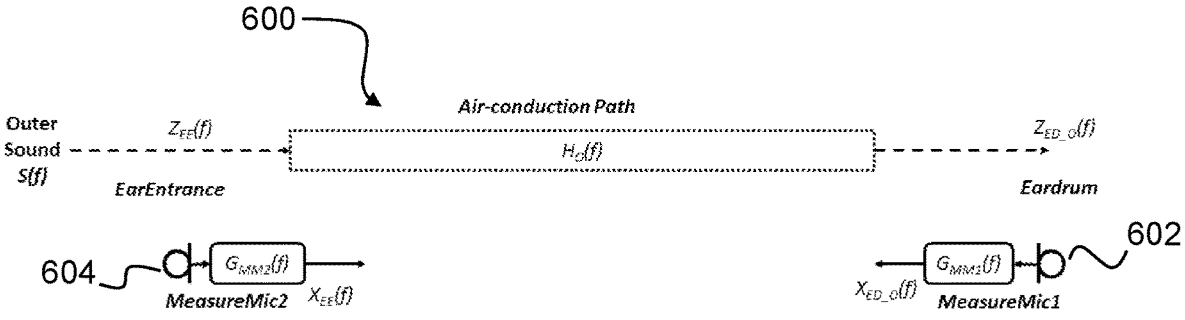
FIG. 6 is a schematic representation of an acoustic conduction path between an ear entrance and an eardrum of the user shown in FIG. 1.

The determination of the open-ear transfer function according to exemplary embodiments of the present disclosure will now be describe with reference to FIG. 6 which illustrates the open-ear system 600. The following assumes that the user 100 is not speaking and thus the bone-conduction path does not contribute to the sound incident at the eardrum.

Referring to FIG. 6, the sound signal received at the eardrum may be defined as:

$$Z_{ED\_O}(f)=Z_{EE}(f)\cdot H_O(f) \tag{1.1}$$

Where:

$Z_{ED\_O}(f)$: sound signal at eardrum in open ear;

$Z_{EE}(f)$: sound signal at ear-entrance (whether open or closed-ear); and $H_O(f)$: open-ear transfer function from ear-entrance to eardrum in open ear.

As mentioned above, in some embodiments $Z_{ED\_O}(f)$ and $Z_{EE}(f)$ may be recorded using a pair of measurement microphones, a first measurement microphone 602 and a second measurement microphone 604. The first measurement microphone 602 may be placed at the ear-entrance and the second measurement microphone 604 may be placed at the ear-drum of the user 100. Preferably, the first and second measurement microphones 602, 604 are matched, i.e. they have the same properties (including frequency response and sensitivity). As mentioned above, this process may be performed specifically on the user or, alternatively, data from the general population pertaining to the open-ear transfer function may be used to approximate the open-ear transfer function of the user 100.

The recorded electrical signals from the first and second measurement microphones 602, 604 may be defined as:

$$X_{ED\_O}(f)=Z_{ED\_O}(f)\cdot G_{MM1}(f) \tag{1.2}$$

$$X_{EE}(f)=Z_{EE}(f)\cdot G_{MM2}(f) \tag{1.3}$$

Where $G_{MM1}(f)$ and $G_{MM2}(f)$ are frequency responses of the first and second measurement microphones 602, 604 respectively. For a typical measurement microphone, their frequency response is flat and equal to a fixed factor $q_{MM}$ (conversion factor from physical sound signal to electrical digital signal) for frequencies between 10 Hz and 20 kHz. $X_{ED\_O}(f)$ is the electrical signal of the first measurement microphone 602 at the eardrum in open ear. This may be approximated using an ear of a KEMAR by using its eardrum microphone. When measuring the open-ear transfer function of the specific user 100 the first measurement microphone 602 may be a probe-tube microphone which can be inserted into ear canal until it touches the eardrum of the user 100. $x_{EE}(f)$ is the electrical signal of the second measurement microphone 604 at ear-entrance.

Provided the first and second measurement microphones 602, 604 are matched:

$$\frac{G_{MM1}(f)}{G_{MM2}(f)} \approx 1 \tag{1.4}$$

So, $H_O(f)$ can be estimated by $X_{ED\_O}(f)$ and $X_{EE}(f)$ as:

$$H_O^E(f) = \frac{X_{ED\_O}(f)}{X_{EE}(f)} = \frac{Z_{ED\_O}(f)\cdot G_{MM1}(f)}{Z_{EE}(f)\cdot G_{MM2}(f)} = H_O(f)\frac{G_{MM1}(f)}{G_{MM2}(f)} \approx H_O(f) \tag{1.5}$$

Where $H_O^E(f)$ is the estimated open-ear transfer function from ear-entrance to eardrum in open ear.

Determining Closed-Ear Transfer Function

Referring again to FIG. 5, an exemplary method for determining the closed-ear transfer function at step 504 of the process 500 will now be described in more detail with reference to FIG. 7 which illustrates the closed-ear system 700 while the user 100 is not making any vocal sounds. As mentioned above, a determination of the closed-loop transfer function is described herein in relation to a single module 202 of the headset 200. It will be appreciated that similar techniques may be employed to determine a closed-loop transfer function for the other module 204 if provided.

In the closed-ear configuration, i.e. when the user 100 is wearing the headset, there exists both an air-conduction path (as was the case in the open-ear scenario of FIG. 6) and an electrical-conduction path between the error microphone 205, the reference microphone 208 and the speaker 209 of the module 202. An additional air-conduction path exists between the speaker 209 and the error microphone 205 as denoted by $H_{S2}(f)$ in FIG. 7.

Figure 7:
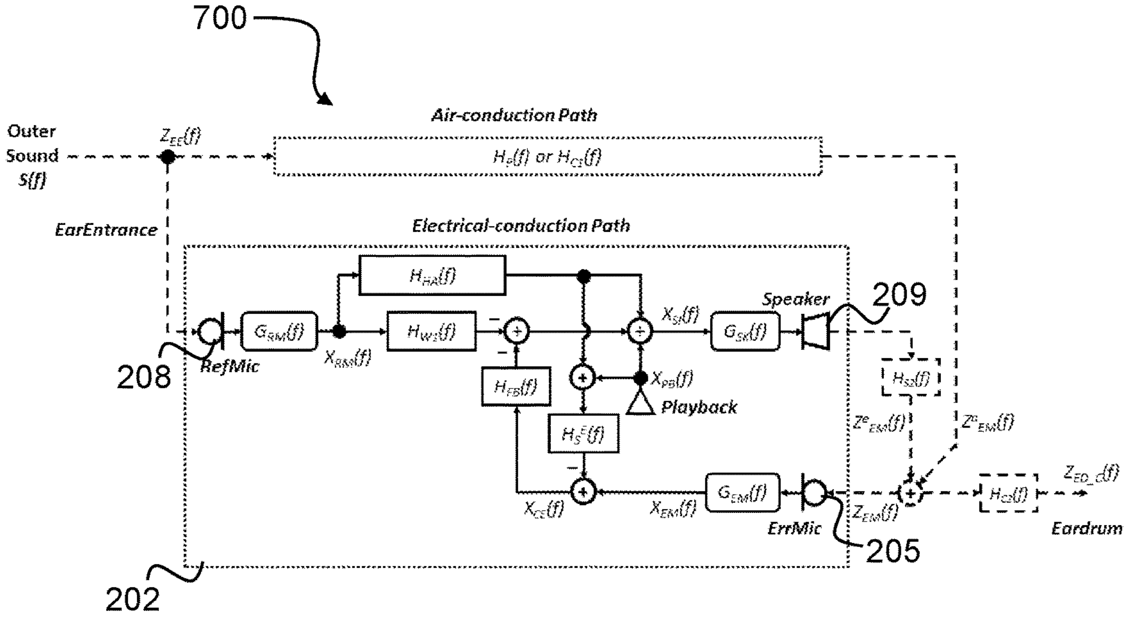
FIG. 7 is a schematic representation of an acoustic-conduction path and an electrical conduction path between an ear entrance and an eardrum of the user shown in FIG. 2 wearing the headset of FIG. 3.

It is noted that the electrical configuration of the module 202 shown in FIG. 7 is provided as an example only and different electrical configurations known in the art fall within the scope of the present disclosure.

The sound signal $Z_{ED\_C}(f)$ at the eardrum in the close-ear scenario may be defined as:

$$Z_{ED\_C}(f)=Z_{EM}(f)\cdot H_{C2}(f) \tag{1.6}$$

Where:

- $Z_{EM}(f)$: sound signal at error microphone 205 position in close ear; and
- $H_{C2}(f)$: transfer function of sound signal from the position of the error microphone 205 to eardrum in close-ear. When the error microphone 205 is close to eardrum, we have $H_{C2}(f)\approx 1$.

The sound signal $Z_{EM}(f)$ at the error microphone 205 may be defined as:

$$Z_{EM}(f)=Z_{EM}^{a}(f)+Z_{EM}^{e}(f) \tag{1.7}$$

Where:

- $Z_{EM}^{a}(f)$: component of the sound signal at the position of the error microphone 205 in close ear contributed by air-conduction path;
- $Z_{EM}^{e}(f)$: component of the sound signal at the position of the error microphone 205 in close ear contributed by electrical-conduction path (taking into account acoustic coupling between the speaker 209 and the error microphone 205).

Embodiments of the present disclosure aim to estimate the sound signal $Z_{EM}(f)$ present at the error microphone 205 by first estimating the component $Z_{EM}^{a}(f)$ of the sound signal present due to air-conduction and second estimating the contribution $Z_{EM}^{e}(f)$ present at the error microphone 205 due to the electrical properties of the module 202 (i.e. the processed electrical signal output to the speaker 209). The inventors have realised that not only is the air-conduction component dependent on fit of the headset 200 on the user 100, but also the electrical-conduction path component $Z_{EM}^{e}(f)$ is dependent both on fit of the headset 200 on the user 100 and also the geometry of the ear canal of the user 100.

Determining $Z_{EM}^{a}(f)$

The acoustic transfer function from the ear-entrance to the eardrum in the closed-ear state (with the headset 200 worn by the user 100) may be defined as:

$$H_C(f)=H_P(f)\cdot H_{C2}(f) \tag{1.8}$$

Where $H_P(f)$ is the transfer function of sound signal from ear-entrance to the error microphone 205 which corresponds to the passive loss of sound caused by the headset 200 and $H_{C2}(f)$ is the transfer function between the error microphone 205 and the eardrum.

The above equation (1.8) may be simplified by assuming that error microphone 205 is very close to the ear drum such that $H_{C2}(f)\approx 1$ and therefore $H_C(f)\approx H_P(f)$.

Figure 8:
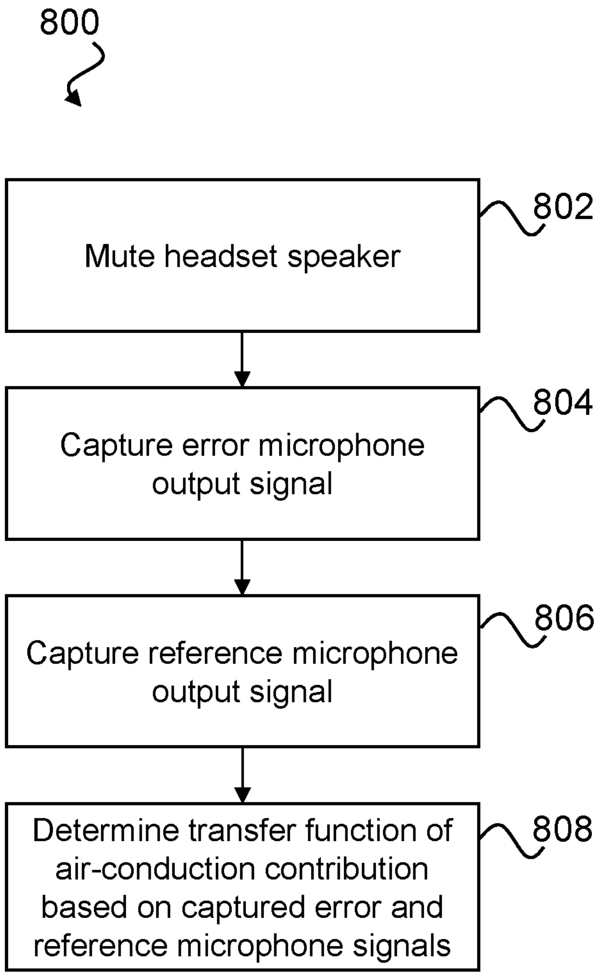
FIG. 8 is a flow diagram showing a process for determining a transfer function of the acoustic-conduction path shown in FIG. 6.

With the above in mind and assuming that the reference microphone 208 is positioned substantially at the ear-entrance, the acoustic path transfer function $H_C(f)$ can be estimated by comparing the sound signal received at the reference microphone 208 with that at the error microphone 205 in-situ while the user 100 is wearing the headset 200. Referring to FIG. 8, at step 802, the headset is muted to ensure that the electrical-conduction path is not contributing to the sound signal reaching the error microphone 205. In the presence of sound external to the headset 200, at step 804, the electrical signal generated by the error microphone 205 may be captured. The sound signal $Z_{EM}^{a}(f)$ at the error microphone may be defined as:

$$Z_{EM}^{a}(f)=Z_{EE}(f)\cdot H_P(f) \tag{1.9}$$

The electrical signal $x_{EM}^{a}(f)$ captured by the error microphone 205 may be defined as:

$$X_{EM}^{a}(f)=Z_{EM}^{a}(f)\cdot G_{EM}(f)=Z_{EE}(f)\cdot H_P(f)\cdot G_{EM}(f) \tag{1.10}$$

Where $G_{EM}(f)$ is the frequency response of error microphone 205, which is typically flat and equals to a fixed factor $q_{EM}$ (conversion factor from physical sound signal to electrical digital signal) for frequencies between 100 Hz and 8 kHz for a MEMS microphone.

At step 806, the electrical signal $X_{RM}(f)$ generated by the reference microphone 208 may be captured. The ear-entrance sound signal $z_{EE}(f)$ can be recorded by the reference microphone 208 as:

$$X_{RM}(f)=Z_{EE}(f)\cdot G_{RM}(f) \tag{1.11}$$

Where $G_{RM}(f)$ is the frequency response of reference microphone 208, which is typically flat and equals to a fixed factor $q_{EM}$ (conversion factor from physical sound signal to electrical digital signal) for frequencies between 100 Hz and 8 kHz for a MEMS microphone.

Assuming the frequency response of the reference and error microphones 208, 205 are matched, then:

$$\frac{G_{EM}(f)}{G_{RM}(f)} \approx 1 \tag{1.12}$$

As such, at step 808, the user specific acoustic transfer function $H_C(f)$ from the ear-entrance to the eardrum in close-ear can be determined based on the captured electrical signals $x_{EM}(f)$, $X_{RM}(f)$ from the error and reference microphones 205, 208 as defined below.

$$H_P^E(f) = \frac{X_{EM}^a(f)}{X_{RM}(f)} = \frac{Z_{EE}(f)\cdot H_P(f)\cdot G_{EM}(f)}{Z_{EE}(f)\cdot G_{RM}(f)} = H_P(f)\frac{G_{EM}(f)}{G_{RM}(f)} \approx H_P(f) \tag{1.13}$$

Determining $Z_{EM}^e(f)$

The inventors have realised that with knowledge of the electrical characteristics of the processing between the reference microphone 208, the error microphone 205 and the speaker 209, the transfer function between the eardrum and ear entrance due to the electrical-conduction path may be determined by comparing the sound output at the speaker 209 and the same sound received at the error microphone 205.

Figure 9:
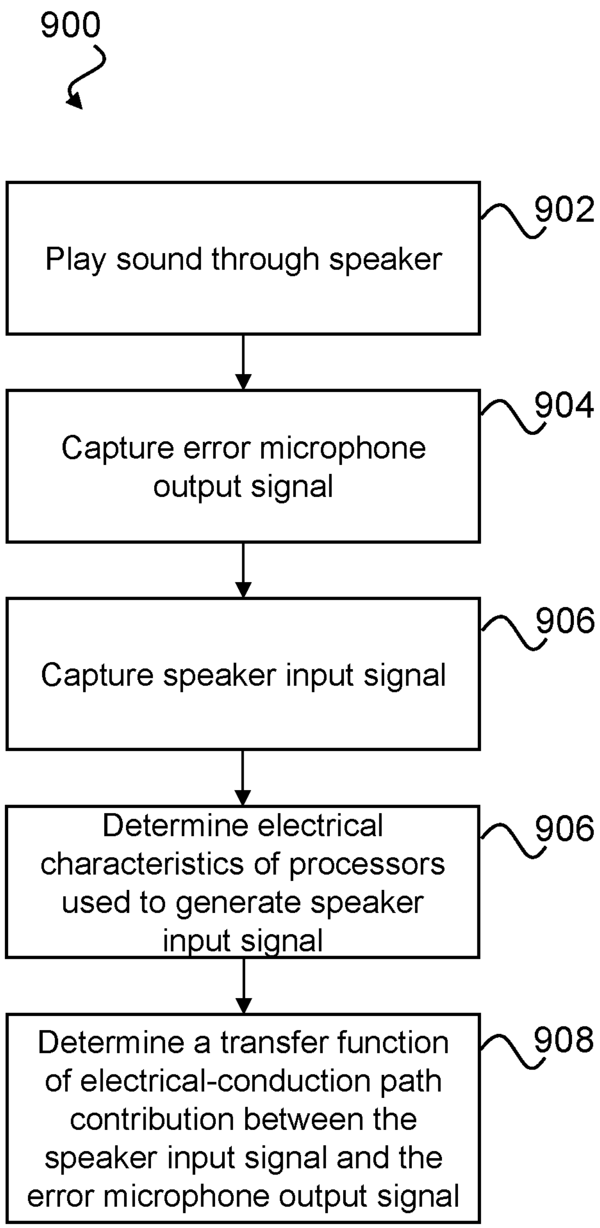
FIG. 9 is a flow diagram showing a process for determining a transfer function of the electrical-conduction path shown in FIG. 7.

FIG. 9 is a flow diagram of a process 900 for determining the component $Z_{EM}^e(f)$ of the sound signal at the position of the error microphone 205 in close ear contributed by electrical-conduction path (taking into account acoustic coupling between the speaker 209 and the error microphone 205).

At step 902, a signal is output to the speaker 209, preferably with any external sound muted so that there is no external sound contribution at the error microphone 205 due to the closed-ear acoustic-conduction path between the ear entrance and the eardrum. The speaker input signal $X_{SI}(f)$ is generated by processing electronics within the module 202.

With outside sound muted, the contribution to the sound signal $Z_{EM}^e(f)$ at the error microphone 205 by the speaker 209 may be defined as:

$$Z_{EM}^e(f)=X_{SI}(f)\cdot G_{SK}(f)\cdot H_{S2}(f) \tag{1.13}$$

Where $H_{S2}(f)$ is the transfer function of the sound signal from the position at the output of the speaker 209 to the position of the error microphone 205 and $G_{SK}(f)$ is frequency response of speaker 209, and $X_{SI}(f)$ is the speaker input signal.

The electrical signal output from the error microphone 205 may therefore be defined as:

$$X_{EM}^e(f)=Z_{EM}^e(f)\cdot G_{EM}(f)=X_{SI}(f)\cdot G_{SK}(f)\cdot H_{S2}(f)\cdot G_{EM}(f) \tag{1.14}$$

Where $G_{EM}(f)$ is the frequency response of the error microphone 205.

The sound signal at headset speaker position can be estimated based on the speaker input $X_{SI}(f)$ signal and the frequency response of the speaker 209. The transfer function between the input signal at the speaker 209 and the error microphone 205 output signal may be defined as:

$$H_S^E(f) = \frac{X_{EM}^e(f)}{X_{S1}(f)} = G_{SK}(f)\cdot H_{S2}(f)\cdot G_{EM}(f) \tag{1.15}$$

From the above equation, since $G_{SK}(f)$ and $G_{EM}(f)$ are fixed $H_S^E(f)$ will be directly proportional to $H_{S2}(f)$ for different ear canal geometries and different headset fit.

The speaker input signal $X_{SI}(f)$ is defined by the back end processing implemented by the module 202. Accordingly, at step 906, the electrical characteristics of the module 202 used to generate the speaker input signal may be determined. In some embodiments, where the headset 200 is noise isolating only (i.e. no active noise cancellation (ANC)) the speaker input signal may be substantially unaffected by processing in the module 202. In some embodiments, however, the headset 200 may implement active noise cancellation. In which case, the speaker input signal $X_{SI}(f)$ will be affected by feedforward and feedback filters as well as hearing augmentation due to equalisation of the speaker input signal $X_{SI}(f)$. In such cases, the speaker input signal $X_{SI}(f)$ may be defined as:

$$X_{SI}(f)=X_{RM}(f)H_{HA}(f)-X_{RM}(f)H_{W1}(f)-X_{CE}(f)H_{FB}(f) \tag{1.16}$$

$$X_{CE}(f)=X_{EM}^e(f)-X_{RM}(f)H_{HA}(f)H_S^E(f)-X_{PB}(f)H_S^E(f) \tag{1.17}$$

Where:

- $H_{HA}(f)$: Hearing augmentation filter used as described herein to implement HAEQ (and dHAEQ below);
- $H_{W1}(f)$: Feedforward (FF) ANC digital filter;
- $H_{FB}(f)$: Feedback (FB) ANC digital filter;
- $X_{PB}(f)$: playback signal (music, internal generated noise, et al.); and
- $X_{CE}(f)$: corrected error signal as the input to FBANC filter.

Thus, at step 908, a transfer function is determined between the error microphone 205 signal, the reference microphone 208 signal and the speaker input signal based on the determined electrical characteristics of the module 202 and the acoustic coupling of the speaker to the error microphone 205.

It is noted that if ANC is not being implemented by the headset, then there will be no feedback or feedforward filtering such that $X_{SI}(f)=X_{RM}(f)H_{HA}(f)$.

When HA is enabled, playback $X_{PB}(f)$ will usually be muted so that the user can hear the sound being restored to their eardrum from outside of the headset. Provided playback is muted and equals zero when the HA function is enabled, equation (1.17) becomes:

$$X_{CE}(f)=X_{EM}^e(f)-X_{RM}(f)H_{HA}(f)H_S^E(f) \tag{1.18}$$

Combining Acoustic-Conduction Path with Electrical-Conduction Path

The air-conduction and electrical-conduction components can be combined as follows:

$$X_{EM}(f) = X_{EM}^a(f) + X_{EM}^e(f) = X_{RM}(f)\cdot H_P^E(f) + \left\{\begin{matrix} X_{RM}(f)H_{HA}(f) - X_{RM}(f)H_{W1}(f) \\ -[X_{EM}(f) - X_{RM}(f)H_{HA}(f)H_S^E(f)]H_{FB}(f) \end{matrix}\right\}\cdot H_S^E(f) \tag{1.19}$$

So:

$$X_{EM}(f) = X_{RM}(f)\cdot\left[\frac{H_P^E(f) - H_{W1}(f)H_S^E(f)}{1 + H_{FB}(f)H_S^E(f)} + H_{HA}(f)H_S^E(f)\right] \tag{1.20}$$

When ANC is perfect, equation (1.20) can be simplified as:

$$X_{EM\_ANCperfect}(f)=X_{RM}(f)H_{HA}(f)H_S^E(f) \tag{1.21}$$

This means that the air-conduction contribution of outer-sound at the eardrum has been totally cancelled and only the electrical-conduction contribution (at the speaker 209) is left.

When ANC is muted, equation (1.20) can be simplified as:

$$X_{EM\_ANCoff}(f)=X_{RM}(f)\cdot[H_P^E(f)+H_{HA}(f)H_S^E(f)] \tag{1.22}$$

It is noted that when $H_P^E(f)$ and $H_{HA}(f)H_S^E(f)$ have similar magnitude but different phase, their summation will produce a comb-filter effect. To reduce the comb-filter effect, it is preferable to ensure that the latency between the electrical-conduction path and air-conduction path is minimized.

Thus, methods described herein can be used to derive an EQ which takes into account the air-conduction path between the ear-entrance and the ear-drum (using the reference to error microphone ratio), the electrical-conduction path within the headset module 202, and the air-conduction path between the speaker 209 and the error microphone 209. Since both air-conduction paths are dependent on headset fit and ear canal geometry, the present embodiments thus provides a technique for in-situ determination of a bespoke EQ for the user 100 of the headset 200.

Derivation of HAEQ

Referring to step 506 of the process 500 shown in FIG. 5, in order to restore sound at the eardrum to an open-ear state in the close-ear configuration, it is an aim to derive an $H_{HA}(f)$ (i.e. the HAEQ) so as to make that sound signal at eardrum $Z_{ED\_C}(f)$ in close ear equals to that $z_{ED\_O}(f)$ in open ear. So, we have:

$$\frac{X_{RM}(f)}{G_{RM}(f)}H_O^E(f) = \frac{X_{RM}(f)\left\{\left[\frac{H_P^E(f)-H_{W1}(f)H_S^E(f)}{1+H_{FB}(f)H_S^E(f)}\right]+H_{HA}(f)H_S^E(f)\right\}}{G_{EM}(f)}\cdot H_{C2}(f) \tag{1.23}$$

So:

$$H_{HA}(f) = \frac{\left[H_O^E(f)\frac{G_{EM}(f)}{G_{RM}(f)}\cdot\frac{1}{H_{C2}(f)}\right]-\left[\frac{H_P^E(f)-H_{W1}(f)H_S^E(f)}{1+H_{FB}(f)H_S^E(f)}\right]}{H_S^E(f)} \tag{1.24}$$

Assuming the error microphone is close to eardrum, we have $H_{C2}(f)\approx 1$. Provided the reference and error microphones 205, 208 have similar properties, $$\frac{G_{EM}(f)}{G_{RM}(f)}\approx 1.$$

So, equation (1.24) can be simplified as:

$$H_{HA}(f)\approx\frac{H_O^E(f)-\left[\frac{H_P^E(f)-H_{W1}(f)H_S^E(f)}{1+H_{FB}(f)H_S^E(f)}\right]}{H_S^E(f)} \tag{1.25}$$

If ANC is operating well, $$\left[\frac{H_P^E(f)-H_{W1}(f)H_S^E(f)}{1+H_{FB}(f)H_S^E(f)}\right]\approx 0,$$

so equation (1.25) can be further simplified as:

$$H_{HA\_ANCperfect}(f)\approx\frac{H_O^E(f)}{H_S^E(f)} \tag{1.26}$$

Thus, when ANC is operating efficiently, the reference and error microphones 208, 205 are matched, and the error microphone 205 is close to the eardrum of the user 100, $H_{HA}(f)$ will be decided only by $H_O^E(f)$ and $H_S^E(f)$.

Thus an HAEQ is determined which restores the sound signal $z_{ED\_C}(f)$ at the eardrum of the user to the open ear state.

It is noted that the frequency response $H_{HA}(f)$ applied at the speaker input can be further decomposed into a default fixed electrical frequency response $H_{HAEE}(f)$ and a tuneable frequency response (or equalizer) $H_{HAEQ}(f)$:

$$H_{HA}(f)=H_{HAEE}(f)\cdot H_{HAEQ}(f) \tag{1.28}$$

Where $H_{HAEE}(f)$ is the default transfer function from the input to the output of $H_{HA}(f)$ when all filters (like equalizer, noise cancellation, et al.) are disabled, and $H_{HAEQ}(f)$ is the equalisation for restoration of the open-ear condition at the eardrum of the user 100. Then, $$H_{HAEQ}(f)\approx\frac{H_O^E(f)-\left[\frac{H_P^E(f)-H_{W1}(f)H_S^E(f)}{1+H_{FB}(f)H_S^E(f)}\right]}{H_{HAEE}(f)H_S^E(f)} \tag{1.29}$$

Equation (1.29) above shows that $H_{HAEQ}(f)$ can be calculated directly after the measurement of $H_O^E(f)$, $H_P^E(f)$, $H_S^E(f)$, and $H_{HAEE}(f)$ with the user 100 wearing the headset 200 (i.e. in-situ measurement), and the knowledge of current values of feedback and feedforward filters $H_{W1}(f)$ and $H_{FB}(f)$ from the headset 200.

The inventors have further realised that the effect of EQ is substantially unaffected when phase is ignored. As such, the above equation (1.29) can be simplified as follows.

$$|H_{HAEQ}(f)|\approx\left|\frac{H_O^E(f)-\left[\frac{H_P^E(f)-H_{W1}(f)H_S^E(f)}{1+H_{FB}(f)H_S^E(f)}\right]}{H_{HAEE}(f)H_S^E(f)}\right|\approx\frac{|H_O^E(f)|-\left|\frac{H_P^E(f)-H_{W1}(f)H_S^E(f)}{1+H_{FB}(f)H_S^E(f)}\right|}{|H_{HAEE}(f)|\cdot|H_S^E(f)|} \tag{1.30}$$

It is noted that $H_{HA}$ (f is preferably designed to restore/compensate but not to cancel sound signal at eardrum. So $|H_{HAEQ}(f)|$ should preferably not be negative. In equation (1.30), $|H_O^E(f)|$ is always larger than or equal to $|H_P^E(f)|$ (no matter whether ANC is switched on or off), so $|H_{HAEQ}(f)|$ should always be positive.

Figure 10A:
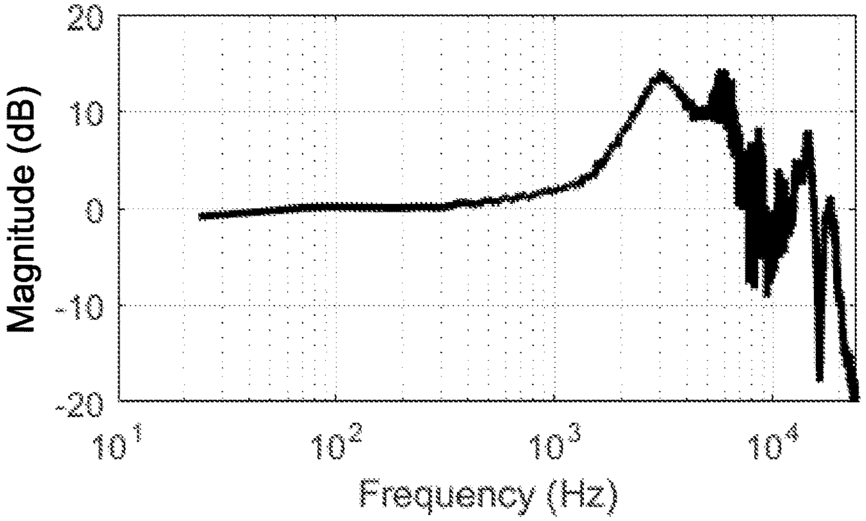
FIG. 10*a* graphically illustrates an estimated open-ear transfer function for the user shown in FIG. 1.
Figure 10B:
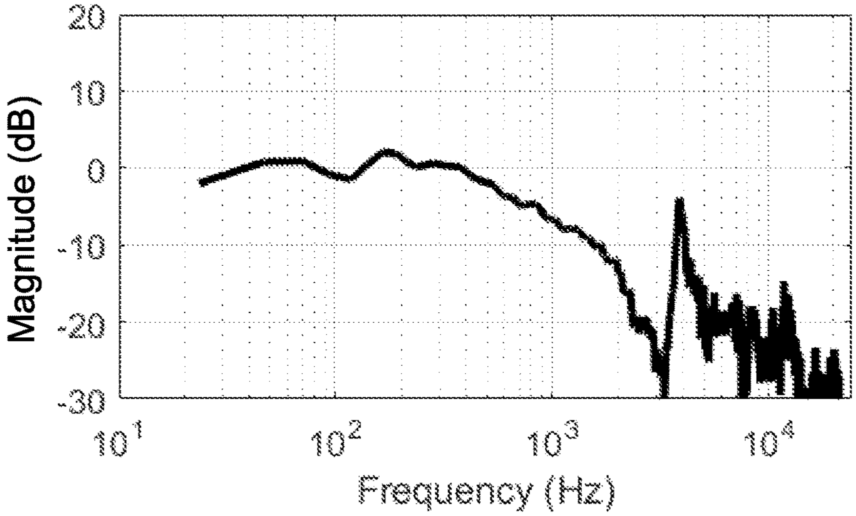
FIG. 10*b* graphically illustrates a measured transfer function between an output of an error microphone and an output of a reference microphone of the module shown in FIG. 4*a;*
Figure 10C:
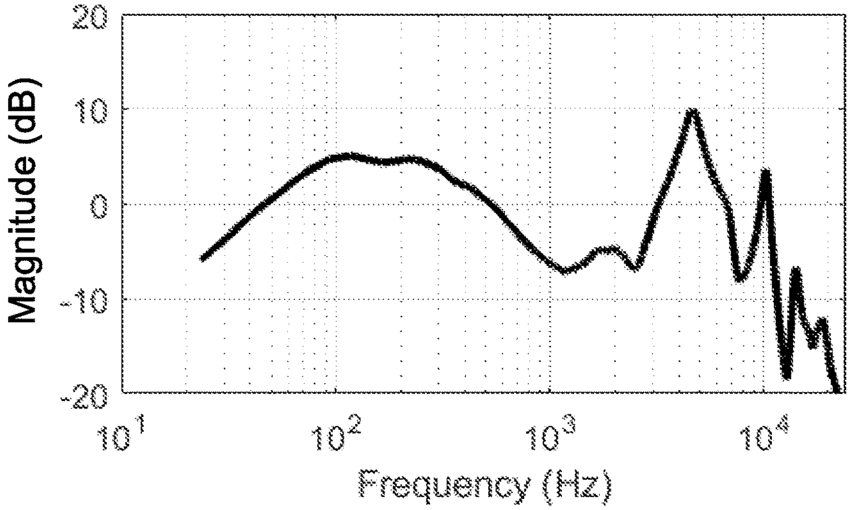
FIG. 10*c* graphically illustrates a measured transfer function between an input of a speaker and an output of an error microphone of FIG. 4*a;*
Figure 10D:
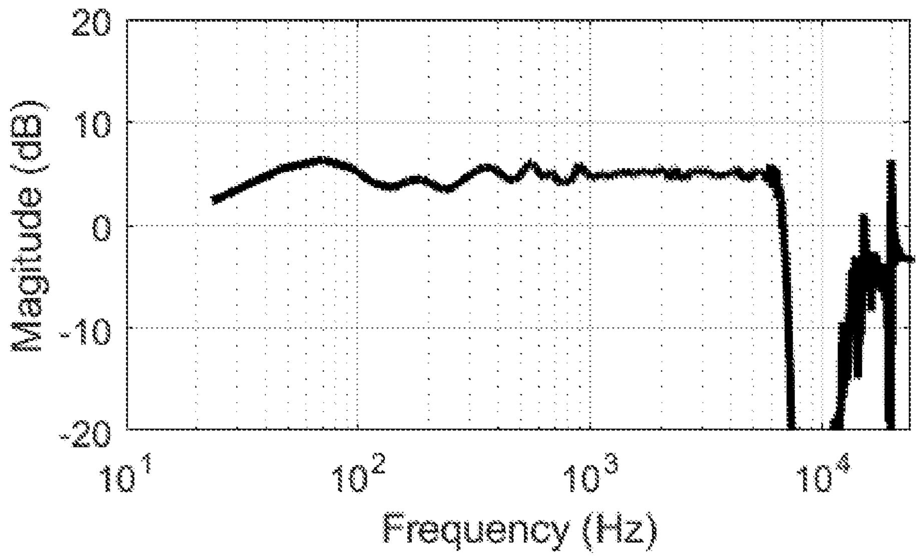
FIG. 10*d* graphically illustrates an example default gain of the module shown in FIG. 4*a;*
Figure 10E:
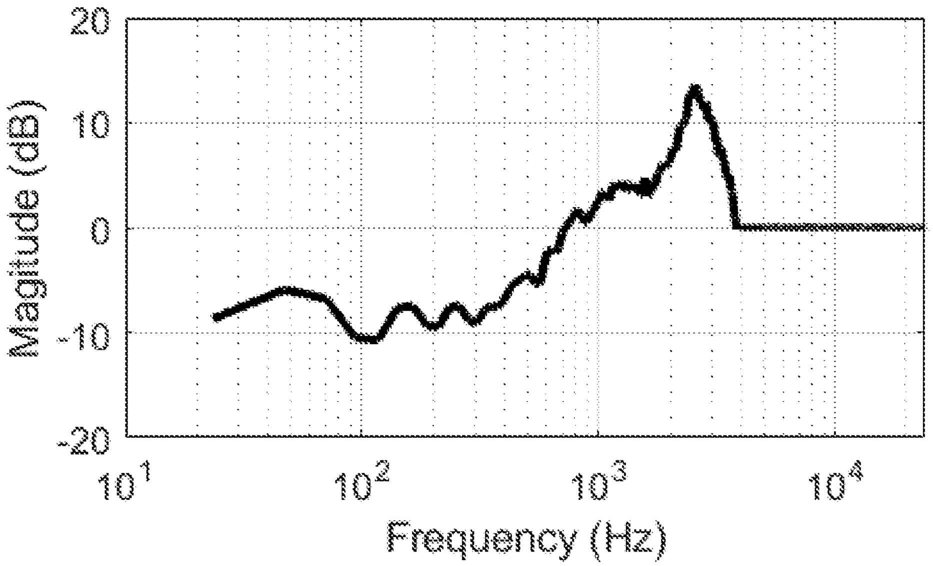
FIG. 10*e* graphically illustrates an example of EQ applied in module shown in FIG. 4*a* for restoring HF attenuation.

FIGS. 10*a* to 10*e*. FIG. 10*a* graphically illustrates an estimated open-ear transfer function for the user 100. FIG. 10*b* graphically illustrates a measured transfer function between the output of the error microphone 205 and the output of the reference microphone 208 of the first module 202 according to the process 800 described above. FIG. 10*c* graphically illustrates a measured transfer function between the input of the speaker 209 and the output of the error microphone 205 according to the process 900 described above. FIG. 10*d* graphically illustrates the default transfer function or gain $H_{HAEE}$ (f) of the headset 200.

In addition to the transfer functions referred to in equation (1.30), two additional transfer functions may be considered. The first may take into account a leakage path $H_L^E$ (f) between the error microphone 205 and the reference microphone 208. The second may take into account the potential for feedback howling by estimating an open-loop transfer function of the module during feedback howling.

When the above referenced paths are considered:

$$X_{EM}(f) = [X_{RM}(f) + X_{EM}(f)H_L^E(f)]\left[\frac{H_P^E(f) - H_{W1}(f)H_S^E(f)}{1 + H_{FB}(f)H_S^E(f)} + H_{HA}(f)H_S^E(f)\right] \tag{1.31}$$

So, $$X_{EM}(f) = X_{RM}(f)\frac{\left[\frac{H_P^E(f) - H_{W1}(f)H_S^E(f)}{1 + H_{FB}(f)H_S^E(f)} + H_{HA}(f)H_S^E(f)\right]}{1 - \left[\frac{H_P^E(f) - H_{W1}(f)H_S^E(f)}{1 + H_{FB}(f)H_S^E(f)} + H_{HA}(f)H_S^E(f)\right]H_L^E(f)} \tag{1.32}$$

Where $H_L^E$ (f) is an estimation of the leakage path when outer-sound is muted, ANC is disabled, and the playback signal is output to the speaker 209.

$$\left[\frac{H_P^E(f) - H_{W1}(f)H_S^E(f)}{1 + H_{FB}(f)H_S^E(f)} + H_{HA}(f)H_S^E(f)\right]H_L^E(f)$$

is the open-loop transfer function of the feedback howling system; this transfer function should be smaller than 1 to avoid the generation of feedback howling.

Figure 11A:
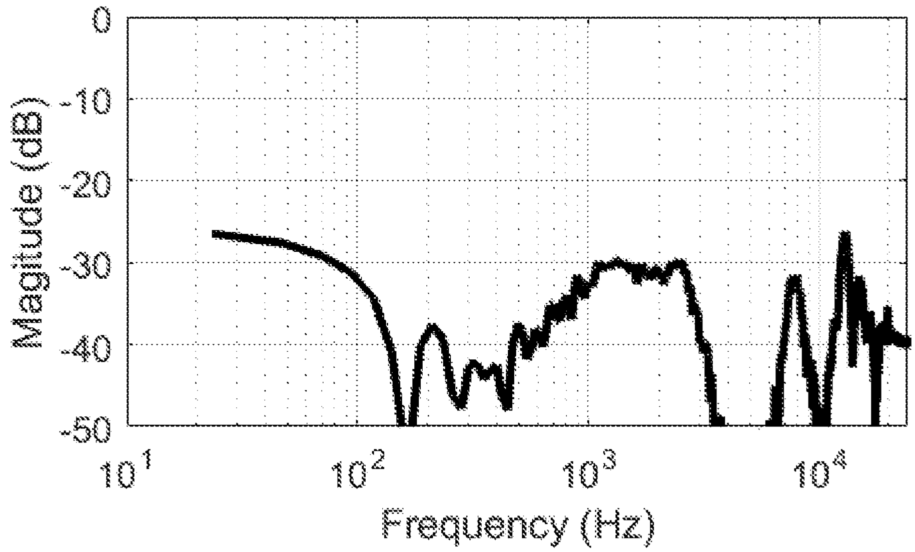
FIG. 11*a* graphically illustrates an estimated leakage path transfer function from an input of a speaker to an output of a reference microphone for the module shown in FIG. 4*a;*
Figure 11B:
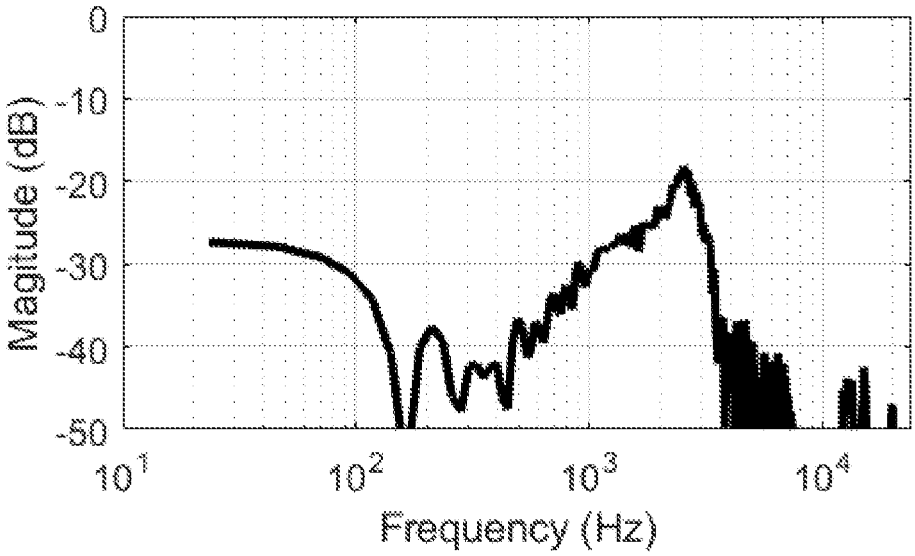
FIG. 11*b* graphically illustrates an open-loop transfer function for a feedback howling system of the module shown in FIG. 4*a;*

FIGS. 11*a* and 11*b* show an estimated leakage path transfer function $H_L^E$ (f) and the open-loop transfer function of the feedback howling system respectively. It can be seen that leakage in the exemplary system is small and the open-loop transfer function of the feedback howling system is much smaller than 1. Accordingly, the derived HAEQ should not cause feedback howling. However, in systems where the open-loop transfer function at some frequencies approaches 1, the HAEQ should be reduced at those frequencies to avoid feedback howling.

Application of HAEQ

Finally, referring back to FIG. 5, at step 508 of the process 500, the HAEQ may be applied to the speaker input signal to restore open-ear sound to the user 100 of the headset 200.

Derivation of dHAEQ for Own Voice

As mentioned above, the effect of blocking the ear with a headset such as the headset 200 described herein is the amplification of the user's 100 own voice at low frequency, which makes their voice sounded boomy to them. This amplification is due to the transmission of the user's voice through the bone and muscle of their head, the so-called bone-conduction path. A determination of dHAEQ may be made in a similar manner to that described above with reference to the process 500 shown in FIG. 5 for determining the HAEQ. However, in addition to the acoustic-conduction path and the electrical-conduction path, the bone-conduction path must be taken into account.

An added complication in addressing low frequency amplification of own voice due to bone conduction is that bone conduction varies with phenome that the user 100 is speaking, since the location of resonance in the mouth changes for different phenomes being spoken. This means that the bone-conduction path is time-varying.

Figure 12:
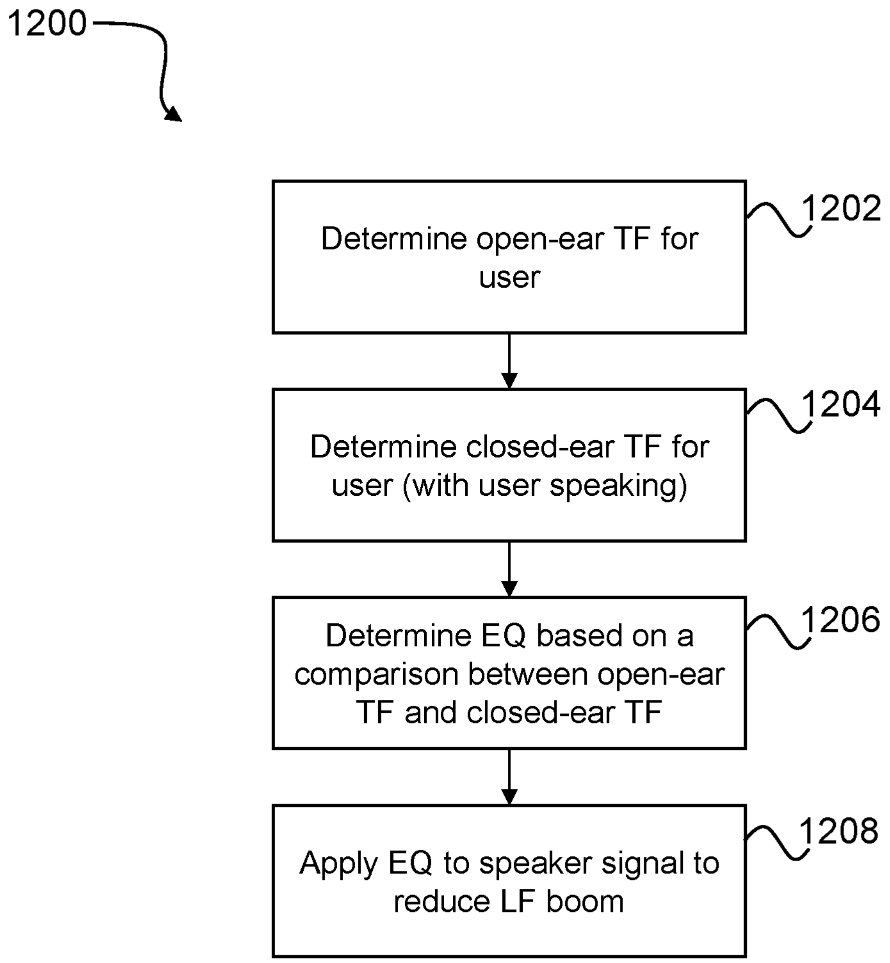
FIG. 12 is a flow diagram showing a process for determining and applying EQ in the module of FIG. 4*a* to attenuated low frequency boost due to the occlusion effect at a user's eardrum.

FIG. 12 is a flow chart of a process 1200 for determining $H_{HA}$(f) to attenuate own-voice boom at the eardrum of the user 100 due to own-voice occlusion.

At step 1202 an open-ear transfer function of the user (i.e. a transfer function of the open ear (TFOE) of the user) may be determined. The open-ear transfer function of the user may be measured, estimated or otherwise determined in the same manner as described above with reference to FIG. 5.

At step 1204, a closed-ear transfer function for the user is determined. The closed-ear transfer function may be representative of the air-conduction, bone-conduction and electrical-conduction paths present with the user 100 wearing the headset 200 and speaking.

At step 1206, hearing augmentation EQ, $H_{HA}$(f), may be determined based on a comparison between the open ear transfer function and the determined closed-ear transfer function for the user 100 wearing the headset 200. For example, the EQ may be determined based on a ratio between open-ear transfer function and the closed-ear transfer function (in the frequency domain) or based on a dB spectral different between the open-ear and closed-ear transfer functions. This EQ represents the difference in sound reaching the eardrum of the user 100 when the user is wearing the headset 200 when the user is speaking versus when the user is not wearing the headset 200 (i.e. the open-ear state).

After the dHAEQ has been determined at step 1206, dHAEQ may be applied at step 1208 to the input signal for the speaker 209 so as to attenuate the low frequency sound reaching the eardrum due to own voice occlusion.

Determining Open-Ear Transfer Function

Figure 13:
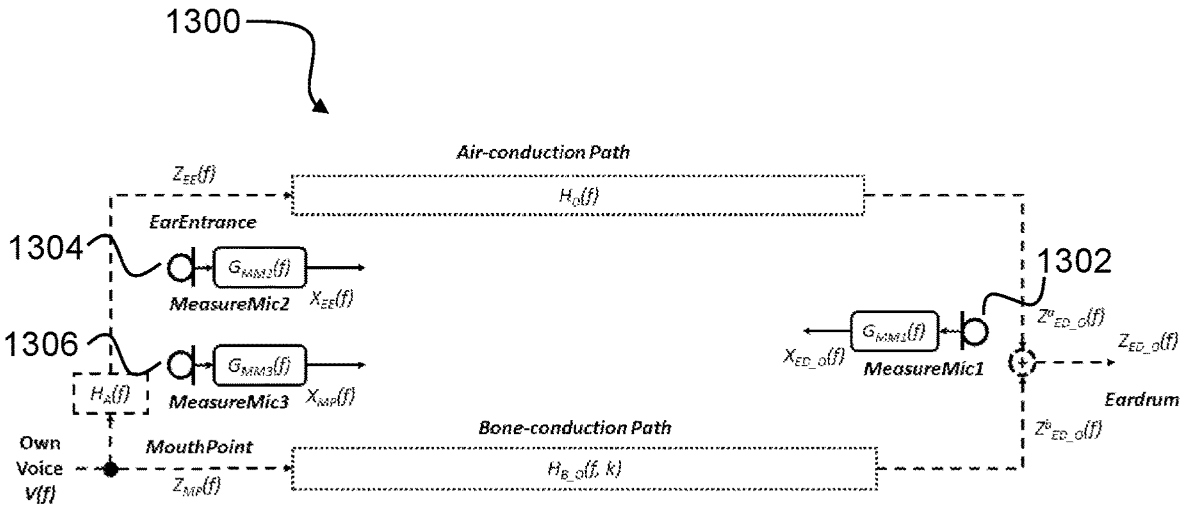
FIG. 13 is a schematic representation of an acoustic-conduction path and a bone-conduction path between an ear entrance and an eardrum of the user shown in FIG. 1 while the user is speaking.

The determination of the open-ear transfer function according to exemplary embodiments of the present disclosure will now be describe with reference to FIG. 13 which illustrates the open-ear system 1300. The following assumes that the user 100 is speaking and thus the bone-conduction path contributes to the sound incident at the eardrum.

Referring to FIG. 13, the open-ear system 1300 can be characterised, for example, using three measurement microphones, herein referred to as first, second and third measurement microphones 1302, 1304, 1306. The first measurement microphone 1302 may be placed at the eardrum in a similar manner to that described above. The second measurement microphone 1304 may be placed at the ear-entrance and the third measurement microphone 1306 may be placed at or near to the mouth of the user. The location of the third measurement microphone 1306 is referred to below as the mouth point.

The acoustic-conduction (AC) path between the mouth and ear entrance of the user can be assumed to be approximately time-invariant. The sound signal at the ear-entrance can thus be defined as:

$$Z_{EE}(f) = Z_{MP}(f)H_A(f) \tag{2.1}$$

Where $Z_{EE}(f)$ is the sound signal at ear-entrance, $Z_{MP}(f)$ is the sound signal of own-voice at the mouth point and $H_A(f)$ is the transfer function of the AC path between the mouth point and the ear-entrance while the user 100 is speaking.

$H_A(f)$ can be estimated using the second and third measurement microphones 1304, 1306 (one at the mouth point and the other at ear-entrance of the user 100), giving:

$$H_A^E(f) = \frac{X_{EE}(f)}{X_{MP}(f)} = \frac{Z_{EE}(f)\cdot G_{MM2}(f)}{Z_{MP}(f)\cdot G_{MM3}(f)} \approx \frac{Z_{EE}(f)}{Z_{MP}(f)} = H_A(f) \tag{2.2}$$

Where $X_{EE}(f)$ and $X_{MP}(f)$ represent the electrical output signals at microphones 1304 and 1306 representing $z_{EE}(f)$ and $Z_{MP}(f)$, respectively.

The AC and BC contributions $Z_{ED\_O}{}^a(f)$ and $Z_{ED\_O}{}^b(f,k)$ at the eardrum may be defined as:

$$Z_{ED\_O}^a(f) = Z_{EE}(f)H_O(f) \tag{2.3}$$

$$Z_{ED\_O}^b(f,k) = Z_{MP}(f)H_{B\_O}(f,k) = Z_{EE}(f)\frac{H_{B\_O}(f,k)}{H_A(f)} \tag{2.4}$$

Where:

- $z_{ED\_O}{}^a(f)$: AC component of own-voice contributed to sound signal at the eardrum in open ear;
- $H_{B\_O}(f,k)$: transfer function of BC path from mouth to eardrum for own-voice; k is the time-varying index of the transfer function; this transfer function usually changes in dependence on the phenome being spoken by the user 100;
- $z_{ED\_O}{}^b(f,k)$: BC component of own-voice contributed to sound signal at eardrum in open ear.

The transfer function of own-voice from ear-entrance to eardrum through the inverse of AC path and then through the BC path in open ear may be defined as:

$$H_{AB\_O}(f,k) = \frac{H_{B\_O}(f,k)}{H_A(f)} \tag{2.5}$$

So, equation (2.4) becomes:

$$Z_{ED\_O}{}^b(f,k) = Z_{EE}(f)H_{AB\_O}(f,k) \tag{2.6}$$

The summation of the AC and BC contributions to sound at the eardrum may then be defined as:

$$Z_{ED\_O}(f,k) = Z_{ED\_O}{}^a(f) + Z_{ED\_O}{}^b(f,k) = Z_{EE}(f)[H_O(f) + H_{AB\_O}(f,k)] \tag{2.7}$$

When $Z_{ED\_O}(f,k)$ and $Z_{EE}(f)$ are recorded by the first and second measurement microphones 1302, 1304 as $X_{ED\_O}(f,k)$ and $X_{EE}(f)$, and $H_O(f)$ has been estimated as with equation (1.4) above, $H_{AB\_O}(f,k)$ can be estimated as:

$$H_{AB\_O}^E(f,k) = \frac{X_{ED\_O}(f,k)}{X_{EE}(f)} - H_O^E(f) \approx H_{AB\_O}(f,k) \tag{2.8}$$

The ratio between the sound signal at the eardrum and the sound signal at the ear-entrance while the user 100 is speaking may be defined as:

$$R_{X\_ED\_O}(f,k) = \frac{X_{ED\_O}(f,k)}{X_{EE}(f)} \tag{2.9}$$

We can also define the ratio between AC and BC contributions of the user's own-voice at eardrum, $R_{Z\_ED\_O}(f,k)$, as:

$$R_{Z\_ED\_O}(f,k) = \frac{Z_{ED\_O}^b(f,k)}{Z_{ED\_O}^a(f)} = \frac{H_{AB\_O}(f,k)}{H_O(f)} \approx R_{X\_ED\_O}(f,k) - 1 \tag{2.10}$$

$R_{Z\_ED\_O}(f,k)$ for different phoneme has been measured and estimated for the general population by previous researchers. The details of an example experimental measurement and estimation is described in Reinfeldt, S., Östli, P., Håkansson, B., & Stenfelt, S. (2010) "Hearing one's own voice during phoneme vocalization-Transmission by air and bone conduction". *The Journal of the Acoustical Society of America,* 128(2), 751-762, the contents of which is hereby incorporated by reference in its entirety.

Determining Own-Voice Closed-Ear Transfer Function

Referring again to FIG. 12, an exemplary method for determining the closed-ear transfer function at step 1204 of the process 1200 will now be described. As mentioned above, a determination of the own-voice closed-loop transfer function is described herein in relation to a single module 202 of the headset 200. It will be appreciated that similar techniques may be employed to determine a closed-loop transfer function for the other module 204 if provided. As mentioned above, it is also noted that the electrical configuration of the module 202 shown in FIG. 14 is provided as an example only and different electrical configurations known in the art fall within the scope of the present disclosure.

Figure 14:
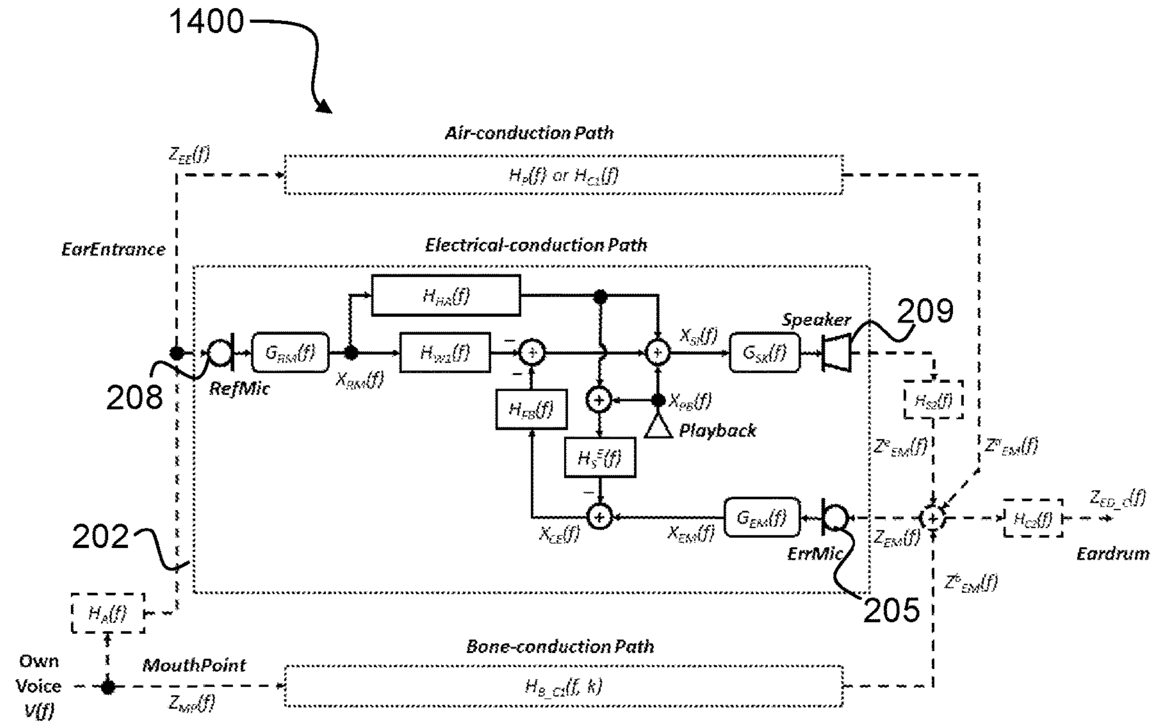
FIG. 14 is a schematic representation of an acoustic-conduction path, a bone-conduction path, and an electrical-conduction path between an ear entrance and an eardrum of the user shown in FIG. 2 wearing the headset of FIG. 3.

An additional air-conduction path exists between the speaker 209 and the error microphone 205 as denoted by $H_{S2}(f)$ in FIG. 14.

In the own-voice closed-ear configuration, i.e. when the user 100 is wearing the headset 200 and is speaking, in addition to the air-conduction and bone-conduction paths which were also present in the open-ear scenario of FIG. 13, there exists an electrical-conduction path between the error microphone 205, the reference microphone 208 and the speaker 209 of the module 202.

The analysis of AC and EC path contributions for own-voice are the same as those described above with reference to FIGS. 5 to 7. The additional bone-conduction (BC) component for own-voice can be added to AC component provided by equation (1.21) to provide an updated equation (1.21) for accounting for own-voice:

$$X_{EM}(f,k) = X_{RM}(f)\cdot\left[\frac{H_{AB\_C1}(f,k) + H_P^E(f) - H_{W1}(f)H_S^E(f)}{1 + H_{FB}(f)H_S^E(f)} + H_{HA}(f)H_S^E(f)\right] \tag{2.11}$$

Where $H_{AB\_C1}(f,k)$ is the transfer function of own-voice from ear-entrance to the position of the error microphone 205 through the inverse of AC path (i.e. ear entrance to mouth point) and then BC path in close ear; k is the time-varying index of the transfer function, which may change as different phoneme are pronounced by the user—different phenomes result in different vocal and mouth shape.

$H_{AB\_C1}(f,k)$ may be defined as:

$$H_{AB\_C1}(f,k)=\frac{H_{B\_C1}(f,k)}{H_A(f)} \tag{2.12}$$

Where $H_{B\_C1}(f,k)$ is the transfer function of the BC path from mouth to the position of the error microphone 205 for own-voice; k is the time-varying index of the transfer function, which may change as different phoneme are pronounced by the user; At frequencies of less than around 1 kHz, $H_{B\_C1}(f,k)$ is usually much larger than $H_{B\_O}(f,k)$ due to the occlusion effect.

When the output at the speaker 209 is muted, equation (2.11) becomes:

$$X_{EM\_ANCoffHAoff}(f,k)=X_{RM}(f)\cdot[H_{AB\_C1}(f,k)+H_P^E(f)] \tag{2.13}$$

So $H_{AB\_C1}(f,k)$ can be estimated as:

$$H_{AB\_C1}^E(f,k)=\frac{X_{EM\_ANCoffHAoff}(f,k)}{X_{RM}(f)}-H_P^E(f)\approx H_{AB\_C1}(f,k) \tag{2.14}$$

Assuming ANC in the module 202 is functioning well, equation (2.12) can be simplified as:

$$X_{EM\_ANCperfect}(f,k)\approx X_{RM}(f)H_{HA}(f)H_S^E(f) \tag{2.15}$$

This means that both AC and BC contributions of the user's 100 own-voice have been totally cancelled at the eardrum and only the EC contribution is left.

When ANC is muted, equation (2.12) can be simplified as:

$$X_{EM\_ANCoff}(f)=X_{RM}(f)\cdot[H_{AB\_C1}(f,k)+H_P^E(f)+H_{HA}(f)H_S^E(f)] \tag{2.16}$$

Because of occlusion effect, for frequencies below 1 kHz, $H_{AB\_C1}(f,k)$ is much larger than $H_P^E(f)$ and $H_{BA}(f)H_S^E(f)$ in equation (2.16).

Derivation of dHAEQ for Own-Voice

Referring to step 1206 of the process 1200 shown in FIG. 12, in order to restore sound at the eardrum to an open-ear state in the close-ear configuration, it is an aim to derive an $H_{HA}(f)$ so as to make that sound signal at eardrum $Z_{ED\_C}(f)$ in lose ear equals to that $z_{ED\_O}(f)$ in open ear.

We have:

$$\frac{X_{RM}(f)}{G_{RM}(f)}[H_O(f)+H_{AB_O}(f,k)]=\frac{X_{EM}(f,k)}{G_{EM}(f)}H_{C2}(f)= \frac{X_{RM}(f)\cdot\left[\frac{H_{AB\_C1}(f,k)+H_P^E(f)-H_{W1}(f)H_S^E(f)}{1+H_{FB}(f)H_S^E(f)}+H_{HA}(f)H_S^E(f)\right]}{G_{EM}(f)}H_{C2}(f) \tag{2.17}$$

So:

$$H_{HA}(f,k)=\frac{\left\{[H_O(f)+H_{AB\_O}(f,k)]\frac{G_{EM}(f)}{G_{RM}(f)}\cdot\frac{1}{H_{C2}(f)}\right\}-\left[\frac{H_{AB\_C1}(f,k)+H_P^E(f)-H_{W1}(f)H_S^E(f)}{1+H_{FB}(f)H_S^E(f)}\right]}{H_S^E(f)} \tag{2.18}$$

Assuming the error microphone 205 is positioned close to the eardrum, $H_{C2}(f)\approx 1$. Then, provided the error and reference microphones 205, 208 are substantially matched, $$\frac{G_{EM}(f)}{G_{RM}(f)}\approx 1.$$

So, equation (2.18) can be simplified as:

$$H_{HA}(f,k)\approx\frac{[H_O(f)+H_{AB\_O}(f,k)]-\left[\frac{H_{AB\_C1}(f,k)}{1+H_{FB}(f)H_S^E(f)}+\frac{H_P^E(f)-H_{W1}(f)H_S^E(f)}{1+H_{FB}(f)H_S^E(f)}\right]}{H_S^E(f)} \tag{2.19}$$

As discussed previously with reference equation (1.25), $H_{HA}(f)$ for outer sound (i.e. external sound not from the user's voice) is always positive. However, $H_{HA}(f)$ for own-voice calculated by equation (2.19) may be negative in some circumstances. This is because $H_{AB\_C1}(f,k)$ can be 30 dB larger than $H_{AB\_O}(f,k)$. Even when ANC is on in the headset 200, the attenuation $[1+H_{FB}(f)H_S^E(f)]$ on $H_{AB\_C1}(f,k)$ is usually less than 30 dB.

Equation (2.19) can be further rewritten as the production of one term which is the same as equation (1.25) above and the other term which is defined as:

$$H_{HA}(f,k)\approx\frac{H_O^E(f)-\left[\frac{H_P^E(f)-H_{W1}(f)H_S^E(f)}{1+H_{FB}(f)H_S^E(f)}\right]}{H_S^E(f)}+\frac{H_{AB\_O}(f,k)-\left[\frac{H_{AB\_C1}(f,k)}{1+H_{FB}(f)H_S^E(f)}\right]}{H_S^E(f)}\approx H_{HAforOS}(f)\left\{1+\frac{H_{AB\_O}(f,k)-\left[\frac{H_{AB\_C1}(f,k)}{1+H_{FB}(f)H_S^E(f)}\right]}{H_O^E(f)-\left[\frac{H_P^E(f)-H_{W1}(f)H_S^E(f)}{1+H_{FB}(f)H_S^E(f)}\right]}\right\} \tag{2.20}$$

Where $H_{HAforOS}(f)$: $H_{HA}(f)$ for outer-sound as described in equation (1.25).

The product term in equation (2.20) may be defined as:

$$H_{dHAEQ}(f,k)=1+\frac{H_{AB\_O}(f,k)-\left[\frac{H_{AB\_C1}(f,k)}{1+H_{FB}(f)H_S^E(f)}\right]}{H_O^E(f)-\left[\frac{H_P^E(f)-H_{W1}(f)H_S^E(f)}{1+H_{FB}(f)H_S^E(f)}\right]} \tag{2.21}$$

From equation (2.21) we can see that when there is no own-voice, $H_{dHAEQ}(f,k)$ becomes 1, and $H_{HA}(f,k)$ will become $H_{HAforOS}(f)$. Thus, $H_{dHAEQ}(f,k)$ represents the additional equalisation required to account for own-voice low frequency boost at the user's eardrum. As the occlusion effect mainly occurs at low frequencies, $H_{dHAEQ}(f,k)$ may only be applied at frequencies below a low frequency threshold. In some embodiments, $H_{dHAEQ}(f,k)$ may be applied at frequencies below 2000 Hz, or below 1500 Hz, or below 1000 Hz or below 500 Hz.

When ANC is functioning well, equation (2.21) can be simplified as:

$$H_{dHAEQ}(f,k) \approx 1 + \frac{H^{E}_{AB\_O}(f,k)}{H^{E}_{O}(f)} = R_{X\_ED\_O}(f,k) \tag{2.22}$$

$R_{X\_ED\_O}(f,k)$ (as defined in equation (2.9)) is the ratio between the output of the error microphone 205 (i.e. the microphone recording at the eardrum) and the output of the reference microphone (i.e. approximately at the ear-entrance of own-voice in open ear).

When ANC is performing well enough to cancel the AC path but not the BC path (this is the most possible case), equation (2.21) can be simplified as:

$$H_{dHAEQ}(f,k) \approx R_{X\_ED\_O}(f,k) - \frac{\left[\frac{H^{E}_{AB\_C1}(f,k)}{1 + H_{FB}(f)H^{E}_{S}(f)}\right]}{H^{E}_{O}(f)} \tag{2.23}$$

When ANC and HA are on, and $H_{HA}(f,k)$ is set as $H_{HAforOS}(f,k)$, we have:

$$\frac{X_{EM\_ANConHAon}(f,k)}{X_{RM}(f)} = \frac{H^{E}_{AB\_C1}(f,k)}{1 + H_{FB}(f)H^{E}_{S}(f)} + H^{E}_{O}(f) \tag{2.24}$$

We can define:

$$R_{X\_EM\_ANConHAon}(f,k) = \frac{X_{EM\_ANConHAon}(f,k)}{X_{RM}(f)} \tag{2.25}$$

So, equation (2.23) can be rewritten as:

$$H_{dHAEQ}(f,k) \approx R_{X\_ED\_O}(f,k) - R_{X\_EM\_ANConHAon}(f,k) + 1 \tag{2.26}$$

It is noted that $R_{X\_ED\_O}(f,k)$ and $R_{X\_EM\_ANConHAon}(f,k)$ in equation (2.26) will always be larger than 1. Additionally, both $R_{X\_ED\_O}(f,k)$ and $R_{X\_EM\_ANConHAon}(f,k)$ are time-varying for different phonemes. Because $R_{X\_ED\_O}(f,k)$ needs to be recorded in open ear but $R_{X\_EM\_ANConHAon}(f,k)$ needs to be recorded in close ear with the user 100 wearing the headset 200, it is difficult to record both in-situ at the same time. Accordingly, in some embodiments, to approximate $R_{X\_ED\_O}(f,k)$ and $R_{X\_EM\_ANConHAon}(f,k)$, during calibration, the user 100 may be asked to read a sentence, preferably a phoneme-balanced sentence both in open ear and closed ear configuration whilst wearing the headset 200 and with ANC and HA enabled. An average of the ratios $\hat{R}_{X\_ED\_O}(f)$ and $\hat{R}_{X\_EM\_ANConHAon}(f)$ may then be determined across the phoneme balanced sentence.

Accordingly, $H_{dHAEQ}(f,k)$ may be fixed as:

$$\hat{H}_{dHAEQ}(f) = \hat{R}_{X\_ED\_O}(f) - \hat{R}_{X\_EM\_ANConHAon}(f) + 1 \tag{2.27}$$

It is further noted that HA block is designed to compensate but not to cancel sound signal at eardrum, so $\hat{H}_{dHAEQ}(f)$ should be limited to larger than zero, for example at least 0.01 as shown below:

$$\hat{H}_{dHAEQ}(f) = \max\{0.01, [\hat{R}_{X\_ED\_O}(f) - \hat{R}_{X\_EM\_ANConHAon}(f) + 1]\} \tag{2.28}$$

The inventors have further discovered that the following equation provides good approximations for $H_{dHAEQ}(f,k)$ and $\hat{H}_{dHAEQ}(f)$:

$$H_{dHAEQ}(f,k) \approx \frac{1}{R_{X_{EM\_ANConHAon}}(f,k)} \approx \frac{X_{RM}(f)}{X_{EM\_ANConHAon}(f,k)} \tag{2.29}$$

$$\hat{H}_{dHAEQ}(f) \approx \frac{1}{\hat{R}_{X\_EM\_ANConHAon}(f)} \approx \frac{X_{RM}(f)}{X_{EM\_ANConHAon}(f)} \tag{2.30}$$

In other words, $\hat{H}_{dHAEQ}(f)$ can be approximated as the ratio between the electrical output of the reference microphone and the electrical output at the error microphone when ANC and HA are switched on.

Figure 15:
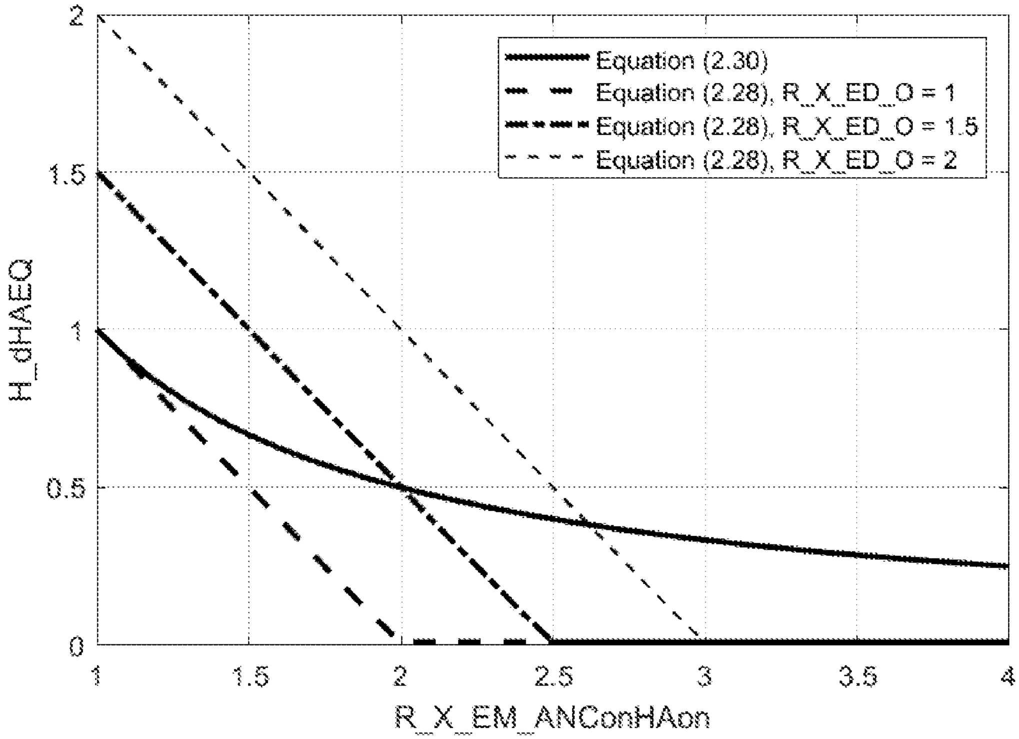
FIG. 15 is a graph comparing theoretically-derived original and approximated EQs for attenuating low frequency boost due to the occlusion effect according to embodiments of the present disclosure.

FIG. 15 provides a comparison of $\hat{H}_{dHAEQ}(f)$ calculated using equation (2.28) for various values of $R_{X\_ED\_O}(f,k)$ versus $\hat{H}_{dHAEQ}(f)$ calculated using equation (2.30). It can be seen that equation (2.30) approximates equation (2.28) provided $R_{X\_ED\_O}(f,k)$ is known. The approximation of equation (2.30) means that it is not necessary to measure the open ear function $R_{X\_ED\_O}(f,k)$; only the close ear function $\hat{R}_{X\_EM\_ANConHAon}(f)$ is needed for the derivation of the approximated $\hat{H}_{dHAEQ}(f)$ using equation (2.28).

Application of dHAEQ

Finally, referring back to FIG. 12, at step 1208 of the process 1200, the dHAEQ may be applied (in combination with the HAEQ for restoring HF attenuation) to the speaker input signal to restore open-ear sound to the user 100 of the headset 200 while the user is speaking.

As mentioned above, whether using $H_{dHAEQ}(f,k)$, $\hat{H}_{dHAEQ}(f)$ or an approximation thereof, this equalisation is only required when the user is speaking. Preferably, therefore, the headset 200 may be configured to determine when the user 100 is speaking so that the total EQ applied by the HA block, i.e. $H_{HA}(f)$ or $H_{HA}(f,k)$, can be switched between $H_{HAEQ}(f)$ (i.e. EQ for restoring HF attenuation due to passive loss) and $H_{HAEQ}(f)+H_{dHAEQ}(f)$ (i.e. the combination of EQ for restoring HF attenuation and EQ for removing LF boom due to the occlusion effect). To do so, the voice activity detector (VAD) 218 may be configured to provide the module 202 with a determination (e.g. flag or probability) of voice activity so that dHAEQ can be switched on and off.

Figure 16:
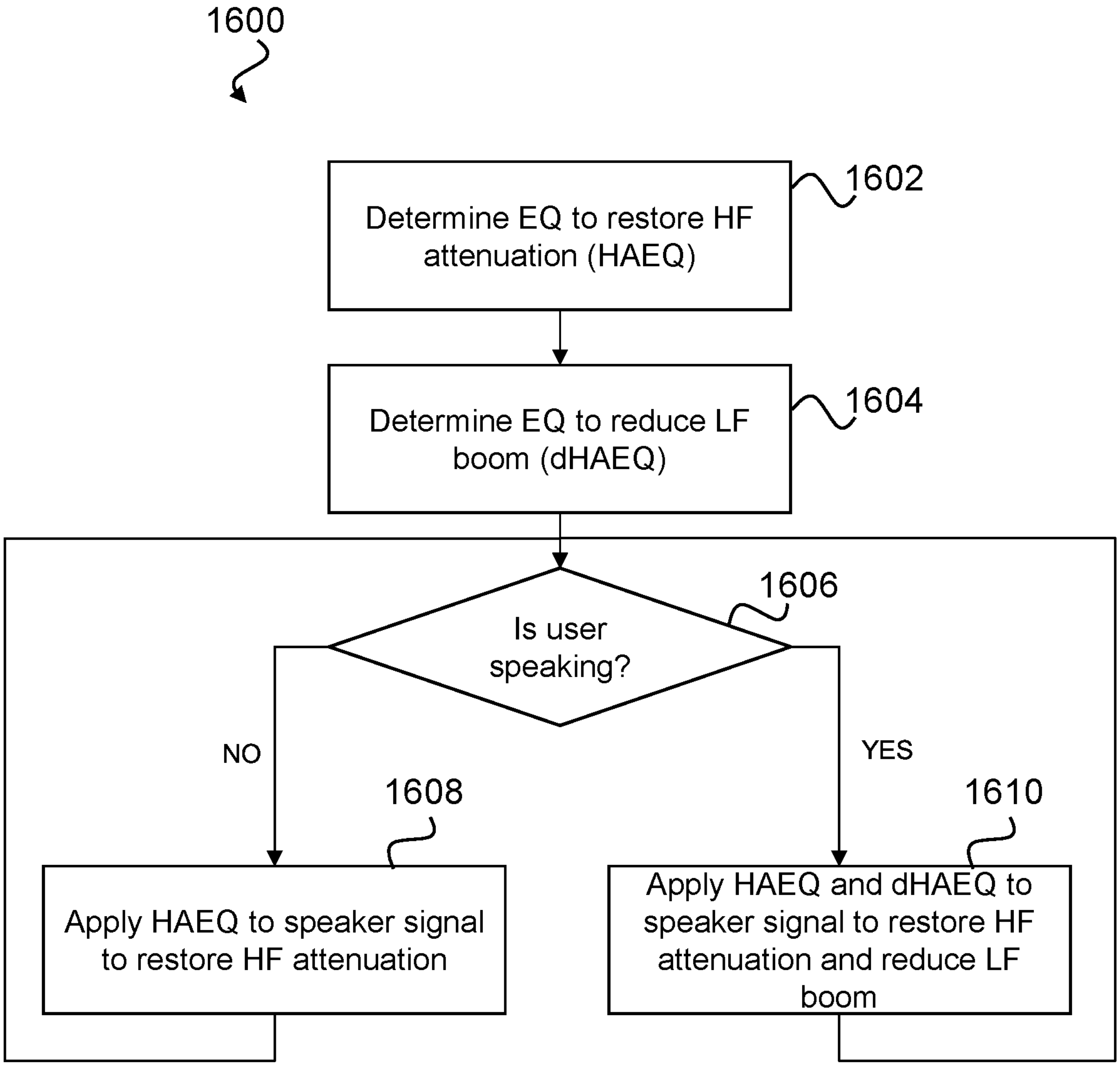
FIG. 16 is a flow diagram of a process for dynamically adjusting EQ applied in the module shown in FIG. 4*a* based on voice activity of the user shown in FIG. 2.

FIG. 16 is a flow diagram of a process 1600 which may be implemented by the first module 202/headset 200 for controlling the HA block, $H_{HA}(f)$.

At step 1602, the HAEQ may be determined as described above with reference to FIG. 5.

At step 1604, the dHAEQ may be determined as describe above with reference to FIG. 12.

At step 1606, the DSP 212 may be configured to make a determination as to whether the user 100 is speaking based on an output received from the VAD 218.

If it is determined that the user 100 is not speaking, then the process 1600 continues to step 1608 and the DSP 212 implements the HA block $H_{HA}$ to include $H_{HAEQ}$ only so as to restore the attenuated high frequency sound lost due to passive loss in the closed-ear state. The process then continues to step 1606 where a determination of whether the user 100 is speaking is repeated.

If, however, it determined that the user 100 is speaking, then the process 1600 continues to step 1610 and the DSP 212 implements the HA block $H_{HA}$ to include $H_{HAEQ}$ and $H_{dHAEQ}$ so as to both restore the attenuated high frequency sound lost due to passive loss in the closed-ear state and suppress the low frequency boost due to the occlusion effect while the user is speaking.

It is noted that since the occlusion effect occurs only at low frequencies, e.g. lower than around 1 kHz, the dHAEQ is preferably only applied at frequencies at which it is required, so as to minimize distortion in the signal output to the speaker 209.

It is noted that whilst it may be preferable to account for both high frequency attenuation and low frequency boost (due to bone conduction), embodiments of the present disclosure are not limited to doing so. For example, in some embodiments, the headset 200 may be configured to implement the HA block so as to equalise for high frequency attenuation and not low frequency (occlusion effect) boost. Equally, in some embodiments, the headset 200 may be configured to implement the HA block so as to equalise for low frequency (occlusion effect) boost and not high frequency attenuation.

Embodiments described herein may be implemented in an electronic, portable and/or battery powered host device such as a smartphone, an audio player, a mobile or cellular phone, a handset. Embodiments may be implemented on one or more integrated circuits provided within such a host device. Alternatively, embodiments may be implemented in a personal audio device configurable to provide audio playback to a single person, such as a smartphone, a mobile or cellular phone, headphones, earphones, etc.

Again, embodiments may be implemented on one or more integrated circuits provided within such a personal audio device. In yet further alternatives, embodiments may be implemented in a combination of a host device and a personal audio device. For example, embodiments may be implemented in one or more integrated circuits provided within the personal audio device, and one or more integrated circuits provided within the host device.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments and implementations likewise, with the benefit of this disclosure, will be apparent to those having ordinary skill in the art, and such embodiments should be deemed as being encompassed herein. Further, those having ordinary skill in the art will recognize that various equivalent techniques may be applied in lieu of, or in conjunction with, the discussed embodiments, and all such equivalents should be deemed as being encompassed by the present disclosure.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the disclosure will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

It should be noted that the above-mentioned embodiments illustrate rather than limit the invention, and that those skilled in the art will be able to design many alternative embodiments without departing from the scope of the appended claims or embodiments. The word "comprising" does not exclude the presence of elements or steps other than those listed in a claim or embodiment, "a" or "an" does not exclude a plurality, and a single feature or other unit may fulfil the functions of several units recited in the claims or embodiments. Any reference numerals or labels in the claims or embodiments shall not be construed so as to limit their scope.

Although the present disclosure and certain representative advantages have been described in detail, it should be understood that various changes, substitutions, and alterations can be made herein without departing from the spirit and scope of the disclosure as defined by the appended claims or embodiments. Moreover, the scope of the present disclosure is not intended to be limited to the particular embodiments of the process, machine, manufacture, compositions of matter, means, methods, or steps, presently existing or later to be developed that perform substantially the same function or achieve substantially the same result as the corresponding embodiments herein may be utilized. Accordingly, the appended claims or embodiments are intended to include within their scope such processes, machines, manufacture, compositions of matter, means, methods, or steps.

The invention claimed is:

1. A method of equalising sound in a headset comprising an internal microphone configured to generate a first audio signal, an external microphone configured to generate a second audio signal, a speaker, and one or more processors coupled between the speaker, the external microphone, and the internal microphone, the method comprising:

determining a first audio transfer function between the first audio signal and the second audio signal while the headset is worn by the user and the user is speaking; and equalising the first audio signal based on the first audio transfer function.

2. The method of claim 1, further comprising:

on determining that the user is speaking, outputting the voice equalised first audio signal to the speaker.

3. The method of claim 1, further comprising:

determining that the one or more processors is implementing active noise cancellation (ANC); and adjusting the equalisation to account for the ANC.

4. The method of claim 1, further comprising:

requesting that the user speak a phoneme balanced sentence or phrase, wherein the first audio transfer function is determined while the user is speaking the phoneme balanced sentence.

5. An apparatus, comprising:

a headset comprising:

an internal microphone configured to generate a first audio signal;

an external microphone configured to generate a second audio signal;

a speaker; and one or more processors configured to:

determine a first audio transfer function between the first audio signal and the second audio signal while the headset is worn by the user and the user is speaking; and equalise the first audio signal based on the difference between the open-ear transfer function and the closed-ear transfer function to generate an equalised first audio signal.

6. The apparatus of claim 5, wherein the one or more processors configured to:

on determining that the user is speaking, output the equalised first audio signal to the speaker.

7. The apparatus of claim 5, wherein the one or more processors configured to:

determine that the one or more processors is implementing active noise cancellation (ANC); and adjust the equalisation to account for the ANC.

8. The apparatus of claim 5, wherein the one or more processors configured to:

request that the user speak a phoneme balanced sentence or phrase, wherein the first audio transfer function is determined while the user is speaking the phoneme balanced sentence.

9. The apparatus of claim 5, wherein the headset comprises one or more of the one or more processors.

10. A non-transitory computer-readable storage medium storing instructions which, when executed by a computer, cause the computer to carry out a method of equalising sound in a headset comprising an internal microphone configured to generate a first audio signal, an external microphone configured to generate a second audio signal, a speaker, and one or more processors coupled between the speaker, the external microphone, and the internal microphone, the method comprising:

determining a first audio transfer function between the first audio signal and the second audio signal while the headset is worn by the user and the user is speaking; and equalising the first audio signal based on the first audio transfer function.

* * * * *